US008184436B2

(12) United States Patent
Campbell et al.

(10) Patent No.: US 8,184,436 B2
(45) Date of Patent: May 22, 2012

(54) LIQUID-COOLED ELECTRONICS RACK WITH IMMERSION-COOLED ELECTRONIC SUBSYSTEMS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 12/825,781

(22) Filed: Jun. 29, 2010

(65) Prior Publication Data
US 2011/0317367 A1    Dec. 29, 2011

(51) Int. Cl.
*G06F 1/20* (2006.01)
*H05K 7/20* (2006.01)

(52) U.S. Cl. .................... 361/700; 361/679.53; 361/701; 361/715; 361/716; 165/104.21; 165/104.33

(58) Field of Classification Search ............. 361/679.46, 361/679.53–679.54, 690, 698–701, 704, 361/715–716; 165/104.21, 104.33, 185; 62/259.2
See application file for complete search history.

(56) References Cited

U.S. PATENT DOCUMENTS

| | | | |
|---|---|---|---|
| 2,125,888 A | 8/1938 | Cordrey | |
| 2,512,545 A | 6/1950 | Hazard | |
| 2,548,325 A | 4/1951 | Smith | |
| 2,643,282 A | 6/1953 | Green | |
| 2,791,888 A | 5/1957 | Vani | |
| 3,109,485 A | 11/1963 | Fortier | |
| 3,143,592 A | 8/1964 | August | |
| 3,226,941 A | 1/1966 | Snelling | |

(Continued)

FOREIGN PATENT DOCUMENTS
DE        10112389 A1    10/2002
(Continued)

OTHER PUBLICATIONS

Notice of Allowance for U.S. Appl. No. 12/256,618 (U.S. Publication No. 201010101759 A1), dated Feb. 10, 2011.

(Continued)

*Primary Examiner* — Robert J Hoffberg
(74) *Attorney, Agent, or Firm* — Dennis Jung, Esq.; Kevin P. Radigan, Esq.; Heslin Rothenberg Farley & Mesiti P.C.

(57) ABSTRACT

Liquid-cooled electronics racks are provided which include: immersion-cooled electronic subsystems; a vapor-condensing heat exchanger to condense dielectric fluid vapor egressing from the immersion-cooled electronic subsystems; a dielectric fluid vapor return coupling in fluid communication the vapor outlets of the immersion-cooled electronic subsystems and the vapor-condensing heat exchanger; a reservoir for holding dielectric fluid; a gravity drain line coupled to drain dielectric fluid condensate from the vapor-condensing heat exchanger to the reservoir; an immersed, sub-cooling heat exchanger disposed within the reservoir; a dielectric fluid supply manifold coupling in fluid communication the reservoir and the dielectric fluid inlets of the immersion-cooled electronic subsystems; and a pump for supplying under pressure dielectric fluid from the reservoir to the dielectric fluid supply manifold for maintaining dielectric fluid in a liquid state within the immersion-cooled electronic subsystems.

20 Claims, 9 Drawing Sheets

U.S. PATENT DOCUMENTS

| | | | |
|---|---|---|---|
| 3,404,730 A | 10/1968 | Kurisu | |
| 3,476,175 A | 11/1969 | Plevyak | |
| 3,512,582 A | 5/1970 | Chu et al. | |
| 3,578,014 A | 5/1971 | Gachot | |
| 3,586,101 A | 6/1971 | Chu et al. | |
| 3,600,636 A | 8/1971 | Petersen | |
| 3,609,991 A | 10/1971 | Chu et al. | |
| 3,774,677 A | 11/1973 | Antonetti et al. | |
| 3,858,090 A | 12/1974 | Lehmann | |
| 4,064,300 A | 12/1977 | Bhangu | |
| 4,108,242 A | 8/1978 | Searight et al. | |
| 4,201,195 A | 5/1980 | Sakhuja | |
| 4,302,793 A | 11/1981 | Rohner | |
| 4,430,866 A | 2/1984 | Willitts | |
| 4,590,538 A | 5/1986 | Cray, Jr. | |
| 4,619,316 A | 10/1986 | Nakayama et al. | |
| 4,622,946 A | 11/1986 | Hurley et al. | |
| 4,694,378 A | 9/1987 | Nakayama et al. | |
| 4,704,658 A | 11/1987 | Yokouchi et al. | |
| 4,741,385 A | 5/1988 | Bergles et al. | |
| 4,750,086 A | 6/1988 | Mittal | |
| 4,912,600 A | 3/1990 | Jaeger et al. | |
| 4,928,206 A | 5/1990 | Porter et al. | |
| 4,928,207 A | 5/1990 | Chrysler et al. | |
| 4,962,444 A | 10/1990 | Niggemann | |
| 5,021,924 A | 6/1991 | Kieda et al. | |
| 5,057,968 A | 10/1991 | Morrison | |
| 5,063,476 A | 11/1991 | Hamadah et al. | |
| 5,067,047 A | 11/1991 | Azar | |
| 5,126,919 A | 6/1992 | Yamamoto et al. | |
| 5,168,348 A | 12/1992 | Chu et al. | |
| 5,183,104 A | 2/1993 | Novotny | |
| 5,220,804 A | 6/1993 | Tilton et al. | |
| 5,270,572 A | 12/1993 | Nakajima et al. | |
| 5,274,530 A | 12/1993 | Anderson | |
| 5,305,184 A | 4/1994 | Anderesen et al. | |
| 5,349,831 A | 9/1994 | Daikoku et al. | |
| 5,406,807 A | 4/1995 | Ashlwake et al. | |
| 5,414,592 A | 5/1995 | Stout et al. | |
| 5,458,185 A | 10/1995 | Mizuno | |
| 5,467,250 A | 11/1995 | Howard et al. | |
| 5,491,363 A | 2/1996 | Yoshikawa | |
| 5,675,473 A | 10/1997 | McDunn et al. | |
| 5,687,577 A | 11/1997 | Ballard et al. | |
| 5,718,117 A | 2/1998 | McDunn et al. | |
| 5,782,101 A | 7/1998 | Dennis | |
| 5,825,621 A | 10/1998 | Giannatto et al. | |
| 5,829,264 A | 11/1998 | Ishigaki et al. | |
| 5,854,092 A | 12/1998 | Root et al. | |
| 5,860,602 A | 1/1999 | Tilton et al. | |
| 5,864,466 A | 1/1999 | Remsburg | |
| 5,880,931 A | 3/1999 | Tilton et al. | |
| 5,907,473 A | 5/1999 | Przilas et al. | |
| 5,943,211 A | 8/1999 | Havey et al. | |
| 5,959,351 A | 9/1999 | Sasaki et al. | |
| 5,963,425 A | 10/1999 | Chrysler et al. | |
| 5,970,731 A | 10/1999 | Hare et al. | |
| 6,000,908 A | 12/1999 | Bunker | |
| 6,016,969 A | 1/2000 | Tilton et al. | |
| 6,019,167 A | 2/2000 | Bishop et al. | |
| 6,026,565 A | 2/2000 | Giannatto et al. | |
| 6,052,284 A | 4/2000 | Suga et al. | |
| 6,055,157 A | 4/2000 | Bartilson | |
| 6,139,361 A | 10/2000 | Przilas et al. | |
| 6,173,577 B1 | 1/2001 | Gold | |
| 6,193,905 B1 | 2/2001 | Yamada et al. | |
| 6,205,799 B1 | 3/2001 | Patel et al. | |
| 6,212,895 B1 | 4/2001 | Richardson | |
| 6,243,268 B1 | 6/2001 | Kang et al. | |
| 6,320,744 B1 | 11/2001 | Sullivan et al. | |
| 6,349,554 B2 | 2/2002 | Patel et al. | |
| 6,366,462 B1 | 4/2002 | Chu et al. | |
| 6,378,605 B1 | 4/2002 | Kutcher et al. | |
| 6,392,891 B1 | 5/2002 | Tzlil et al. | |
| 6,393,853 B1 | 5/2002 | Vukovic et al. | |
| 6,404,640 B1 | 6/2002 | Ishimine et al. | |
| 6,431,260 B1 | 8/2002 | Agonafer et al. | |
| 6,457,321 B1 | 10/2002 | Patel et al. | |
| 6,462,941 B1 | 10/2002 | Hulick et al. | |
| 6,519,151 B2 | 2/2003 | Chu et al. | |
| 6,536,510 B2 | 3/2003 | Khrustalev et al. | |
| 6,571,569 B1 | 6/2003 | Rini et al. | |
| 6,574,104 B2 | 6/2003 | Patel et al. | |
| 6,581,388 B2 | 6/2003 | Novotny et al. | |
| 6,616,469 B2 | 9/2003 | Goodwin et al. | |
| 6,621,707 B2 | 9/2003 | Ishimine et al. | |
| 6,644,058 B2 | 11/2003 | Bash et al. | |
| 6,646,879 B2 | 11/2003 | Pautsch | |
| 6,708,515 B2 | 3/2004 | Malone et al. | |
| 6,807,056 B2 | 10/2004 | Kondo et al. | |
| 6,817,196 B2 | 11/2004 | Malone et al. | |
| 6,828,675 B2 | 12/2004 | Memory et al. | |
| 6,927,980 B2 | 8/2005 | Fukuda et al. | |
| 6,955,062 B2 | 10/2005 | Tilton et al. | |
| 6,973,801 B1 | 12/2005 | Campbell et al. | |
| 6,976,528 B1 | 12/2005 | Tilton et al. | |
| 7,011,143 B2 | 3/2006 | Corrado et al. | |
| 7,012,807 B2 | 3/2006 | Chu et al. | |
| 7,057,893 B2 | 6/2006 | Nicolai et al. | |
| 7,079,393 B2 | 7/2006 | Colgan et al. | |
| 7,088,585 B2 | 8/2006 | Chu et al. | |
| 7,104,078 B2 | 9/2006 | Tilton | |
| 7,106,590 B2 | 9/2006 | Chu et al. | |
| 7,134,289 B2 | 11/2006 | Patel et al. | |
| 7,143,605 B2 | 12/2006 | Rohrer et al. | |
| 7,187,549 B2 | 3/2007 | Teneketges | |
| 7,191,954 B2 | 3/2007 | Kline | |
| 7,222,502 B2 | 5/2007 | Kobayashi et al. | |
| 7,233,491 B2 | 6/2007 | Faneuf et al. | |
| 7,251,139 B2 | 7/2007 | Bhattacharya et al. | |
| 7,252,100 B1 | 8/2007 | Downes et al. | |
| 7,258,161 B2 | 8/2007 | Cosley et al. | |
| 7,272,005 B2 | 9/2007 | Campbell et al. | |
| 7,285,851 B1 | 10/2007 | Cepeda-Rizo et al. | |
| 7,286,356 B2 | 10/2007 | Keenan et al. | |
| 7,295,436 B2 | 11/2007 | Cheon | |
| 7,295,440 B2 | 11/2007 | Ganev et al. | |
| 7,309,209 B2 | 12/2007 | Amiot et al. | |
| 7,349,213 B2 | 3/2008 | Campbell et al. | |
| 7,355,852 B2 | 4/2008 | Pfahnl | |
| 7,362,574 B2 | 4/2008 | Campbell et al. | |
| 7,365,973 B2 | 4/2008 | Rasmussen et al. | |
| 7,372,698 B1 | 5/2008 | Tilton et al. | |
| 7,375,962 B2 | 5/2008 | Campbell et al. | |
| 7,380,409 B2 | 6/2008 | Campbell et al. | |
| 7,385,810 B2 | 6/2008 | Chu et al. | |
| 7,392,660 B2 | 7/2008 | Tilton et al. | |
| 7,392,823 B2 | 7/2008 | Dong et al. | |
| 7,400,505 B2 | 7/2008 | Campbell et al. | |
| 7,403,392 B2 | 7/2008 | Attlesey et al. | |
| 7,408,776 B2 | 8/2008 | Campbell et al. | |
| 7,414,845 B2 | 8/2008 | Attlesey et al. | |
| 7,420,808 B2 | 9/2008 | Campbell et al. | |
| 7,428,151 B2 | 9/2008 | Sonnabend et al. | |
| 7,436,666 B1 | 10/2008 | Konshak | |
| 7,450,384 B2 | 11/2008 | Tavassoli et al. | |
| 7,450,385 B1 | 11/2008 | Campbell et al. | |
| 7,466,549 B2 | 12/2008 | Dorrich et al. | |
| 7,477,513 B1 | 1/2009 | Cader et al. | |
| 7,477,514 B2 | 1/2009 | Campbell et al. | |
| 7,495,914 B2 | 2/2009 | Tilton et al. | |
| 7,531,142 B2 | 5/2009 | Huziwara et al. | |
| 7,559,207 B2 | 7/2009 | Knight et al. | |
| 7,561,425 B2 | 7/2009 | Mindock et al. | |
| 7,602,608 B2 | 10/2009 | Tilton et al. | |
| 7,609,518 B2 | 10/2009 | Hopton et al. | |
| 7,630,795 B2 | 12/2009 | Campbell et al. | |
| 7,639,499 B1 | 12/2009 | Campbell et al. | |
| 7,641,101 B2 | 1/2010 | Campbell et al. | |
| 7,654,100 B2 | 2/2010 | Rini et al. | |
| 7,660,109 B2 | 2/2010 | Iyengar et al. | |
| 7,661,463 B2 | 2/2010 | Liu | |
| 7,724,524 B1 | 5/2010 | Campbell et al. | |
| 7,885,070 B2 * | 2/2011 | Campbell et al. | 361/699 |
| 7,916,483 B2 | 3/2011 | Campbell et al. | |
| 7,944,694 B2 * | 5/2011 | Campbell et al. | 361/699 |
| 7,961,475 B2 | 6/2011 | Campbell et al. | |

| | | |
|---|---|---|
| 7,983,040 B2 | 7/2011 | Campbell et al. |
| 8,014,150 B2 | 9/2011 | Campbell et al. |
| 2002/0062945 A1 | 5/2002 | Hocker et al. |
| 2003/0230401 A1 | 12/2003 | Pfister et al. |
| 2004/0008490 A1 | 1/2004 | Cheon |
| 2004/0057211 A1 | 3/2004 | Kondo et al. |
| 2005/0207116 A1 | 9/2005 | Yatskov et al. |
| 2005/0241802 A1 | 11/2005 | Malone et al. |
| 2005/0244280 A1 | 11/2005 | Malone et al. |
| 2005/0254214 A1 | 11/2005 | Salmon |
| 2006/0126296 A1 | 6/2006 | Campbell et al. |
| 2006/0162365 A1 | 7/2006 | Hoang et al. |
| 2006/0180300 A1 | 8/2006 | Lenehan et al. |
| 2007/0025081 A1 | 2/2007 | Berlin et al. |
| 2007/0035937 A1 | 2/2007 | Colbert et al. |
| 2007/0121295 A1 | 5/2007 | Campbell et al. |
| 2007/0159797 A1 | 7/2007 | Teneketges |
| 2007/0193300 A1 | 8/2007 | Tilton et al. |
| 2007/0199204 A1 | 8/2007 | Knight et al. |
| 2007/0199340 A1 | 8/2007 | Knight et al. |
| 2007/0201210 A1 | 8/2007 | Chow et al. |
| 2007/0227710 A1 | 10/2007 | Belady et al. |
| 2007/0291452 A1 | 12/2007 | Gilliland et al. |
| 2007/0295480 A1 | 12/2007 | Campbell et al. |
| 2007/0297136 A1 | 12/2007 | Konshak |
| 2008/0002363 A1 | 1/2008 | Campbell et al. |
| 2008/0018212 A1 | 1/2008 | Spearing et al. |
| 2008/0024991 A1 | 1/2008 | Colbert et al. |
| 2008/0062639 A1 | 3/2008 | Campbell et al. |
| 2008/0123297 A1 | 5/2008 | Tilton et al. |
| 2008/0158818 A1 | 7/2008 | Clidaras et al. |
| 2008/0196868 A1 | 8/2008 | Attlesey et al. |
| 2008/0209931 A1 | 9/2008 | Stevens |
| 2008/0225478 A1 | 9/2008 | Goettert et al. |
| 2009/0080173 A1 | 3/2009 | Schmidt et al. |
| 2009/0086428 A1 | 4/2009 | Campbell et al. |
| 2009/0086432 A1 | 4/2009 | Campbell et al. |
| 2009/0126909 A1 | 5/2009 | Ellsworth, Jr. et al. |
| 2009/0126910 A1 | 5/2009 | Campbell et al. |
| 2009/0133866 A1 | 5/2009 | Campbell et al. |
| 2009/0238235 A1 | 9/2009 | Campbell et al. |
| 2009/0260777 A1 | 10/2009 | Attlesey |
| 2009/0268404 A1 | 10/2009 | Chu et al. |
| 2009/0314467 A1 | 12/2009 | Campbell et al. |
| 2009/0316360 A1 | 12/2009 | Campbell et al. |
| 2010/0101759 A1 | 4/2010 | Campbell et al. |
| 2010/0101765 A1 | 4/2010 | Campbell et al. |
| 2010/0103614 A1 | 4/2010 | Campbell et al. |
| 2010/0103618 A1 | 4/2010 | Campbell et al. |
| 2010/0103620 A1 | 4/2010 | Campbell et al. |
| 2010/0246118 A1 | 9/2010 | Attlesey |
| 2011/0315344 A1* | 12/2011 | Campbell et al. ............ 165/80.4 |
| 2011/0315353 A1* | 12/2011 | Campbell et al. ........ 165/104.31 |
| 2011/0315355 A1* | 12/2011 | Campbell et al. ........ 165/104.33 |

FOREIGN PATENT DOCUMENTS

| | | |
|---|---|---|
| JP | 8-254512 A | 10/1996 |
| JP | 2002-374086 | 12/2002 |
| WO | 2009131810 | 10/2009 |

OTHER PUBLICATIONS

RD 323064 A, Mar. 10, 1991, English Document.
Office Action for U.S. Appl. No. 12/256,631 (U.S. Patent Publication No. 2010-0103614 A1), dated Apr. 21, 2010, 8 pages.
Office Action for U.S. Appl. No. 12/256,628 (U.S. Patent Publication No. 2010-0103618 A1), dated Aug. 5, 2010, 25 pages.
Office Action for U.S. Appl. No. 12/256,605 (U.S. Patent Publication No. 2010/0103620 A1), dated Aug. 10, 2010, 6 pages.
Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010, 50 pages.
Campbell et al., "Immersion-Cooling Apparatus and Method for an Electronic Subsystem of an Electronics Rack", U.S. Appl. No. 12/825,756, filed Jun. 29, 2010, 39 pages.
Campbell et al., "Interleaved, Immersion-Cooling Apparatus and Method for an Electronic Subsystem of an Electronics Rack", U.S. Appl. No. 12/825,761, filed Jun. 29, 2010, 35 pages.
Campbell et al., "Interleaved, Immersion-Cooling Apparatuses and Methods for Cooling Electronic Subsystems", U.S. Appl. No. 12/825,776, filed Jun. 29, 2010, 55 pages.
Office Action for U.S. Appl. No. 12/256,618 (U.S. Patent Publication No. 2010/0101759 A1), dated Aug. 30, 2010.
Hwang, U., "Heat Exchanger for Vapor Condensation by Dropwise Technique", IBM Technical Disclosure Bulletin, Publication No. IPCOM000089717D (Dec. 1, 1977), 3 pages.
Chu et al.,"Dielectric Fluidized Cooling System", IBM Technical Disclosure Bulletin, Publication No. IPCOM000088682D (Jul. 1, 1977), 3 pages.
Oktay et al., "Subcooled Flow Boiling with Flow Pattern Control", IBM Technical Disclosure Bulletin, Publication No. IPCOM000067827D (Oct. 1, 1979), 3 pages.
Hwang et al., "Evaporation Cooling Module", IBM Technical Disclosure Bulletin, Publication No. IPCOM000066472D (Mar. 1, 1979), 3 pages.
Campbell et al., "Suspended Integrated Manifold System with Serviceability for large Planar Arrays of Electronic Modules", IBM Technical Disclosure, Publication No. IPCOM000126455D (Jul. 18, 2005), 5 pages.
International Application No. PCT/EP20091060792, filed Aug. 20, 2009. Notification of International Search Report, dated Dec. 23, 2009, 12 pages.
Chee, B., "Supermicro Water Cooled Blades", Info World, Geeks in Paradise, (Mar. 5, 2008), http://weblog.infoworld.com/geeks/archives/2008/03, 3 pages.
D. Delia et al., "System Cooling Design for the Water-Cooled IBM Enterprise System/900 Processors", IBM Journal of Research and Development, vol. 36, No. 4 pp. 791-803 (Jul. 1992), 13 pages.
Miyahara, M., "Small Fans for Cooling Small Electronic Devices", Electronics Cooling Magazine, online article retrieved from http://electronics-cooling.com/html/2009_may_techbrief.php (Aug. 31, 2009), 2 pages.
Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994), 8 pages.
Zamanabadi et al., "Hybrid Control Challenges in Refrigeration Systems", Danfoss A/A, Denmark, Advanced Engineering—Refrigeration and Air Conditioning, EECI (2007), 39 pages.
Campbell et al., "Condenser Fin Structures Facilitating Vapor Condensation Cooling of Coolant", U.S. Appl. No. 12/491,286, filed Jun. 25, 2009, 44 pages.
Campbell et al., "Condenser Structures with Fin Cavities Facilitating Vapor Condensation Cooling of Coolant", U.S. Appl. No. 12/491,287, filed Jun. 25, 2009, 39 pages.
Campbell et al., "Apparatus and Method for Adjusting Coolant Flow Resistance Through Liquid-Cooled Electronics Rack(s)", U.S. Appl. No. 12/556,040, filed Sep. 9, 2009, 58 pages.
Campbell et al., "Apparatus and Method with Forced Coolant Vapor Movement for Facilitating Two-Phase Cooling of an Electric Device", U.S. Appl. No. 12/565,175, filed Sep. 23, 2009, 50 pages.
Campbell et al., "Liquid-Cooled Electronics Apparatus and Methods of Fabrication", U.S. Appl. No. 12/566,081, filed Sep. 24, 2009, 47 pages.
Campbell et al., "Compliant Conduction Rail Assembly and Method Facilitating Cooling of an Electronics Structure", U.S. Appl. No. 12/570,215, filed Sep. 30, 2009, 41 pages.
Campbell et al., "Cooled Electronic Module with Pump-Enhanced, Dielectric Fluid Immersion-Cooling", U.S. Appl. No. 12/491,281, filed Jun. 25, 2009, 49 pages.
Campbell et al., "System and Method for Standby Mode Cooling of a Liquid-Cooled Electronics Rack", U.S. Appl. No. 12/567,954, filed Sep. 28, 2009, 52 pages.
Campbell et al., "Cooling System and Method Minimizing Power Consumption in Cooling Liquid-Cooled Electronics Racks", U.S. Appl. No. 12/556,066, filed Sep. 9, 2009, 59 pages.

Office Action for U.S. Appl. No. 12/256,623 (U.S. Patent Publication No. 2010/0101765 Al), dated Nov. 5, 2010.
Campbell et al., Notice of Allowance for U.S. Appl. No. 12/825,756, filed Jun. 29, 2010 (U.S. Patent Publication No. 2011/0315355 A1), dated Jan. 13, 2012.

Campbell et al., Notice of Allowance for U.S. Appl. No. 12/985,552, filed Jan. 6, 2011 (U.S. Patent Publication No. 2011/0103019 A1), dated Feb. 16, 2012.

* cited by examiner

000
LIQUID-COOLED ELECTRONICS RACK WITH IMMERSION-COOLED ELECTRONIC SUBSYSTEMS

BACKGROUND

The present invention relates in general to apparatuses and methods for facilitating cooling of rack-mounted assemblages of individual electronic units, such as rack-mounted computer server units.

The power dissipation of integrated circuit chips, and the modules containing the chips, continues to increase in order to achieve increases in processor performance. This trend poses cooling challenges at the module, subsystem and system levels.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the availability of the room air-conditioning to effectively handle the load. This is especially true for large installations with "server farms" or large banks of computer racks close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid-coolant.

BRIEF SUMMARY

The shortcomings of the prior art are overcome and additional advantages are provided through the provision of a liquid-cooled electronics rack comprising a plurality of immersion-cooled electronic subsystems, each immersion-cooled electronic subsystem including: a housing at least partially surrounding and forming a sealed compartment about the electronic subsystem, the electronic subsystem comprising a plurality of electronic components to be cooled; a dielectric fluid disposed within the sealed compartment, wherein the plurality of electronic components to be cooled are at least partially immersed within the dielectric fluid; and a dielectric fluid inlet and a dielectric fluid vapor outlet in fluid communication with the sealed compartment, wherein dielectric fluid is provided to the sealed compartment via the dielectric fluid inlet and dielectric fluid vapor egresses from the sealed compartment via the dielectric fluid vapor outlet. The liquid-cooled electronics rack further includes: a vapor-condensing heat exchanger to facilitate condensing of dielectric fluid vapor egressing from the sealed compartments of the plurality of immersion-cooled electronic subsystems; a dielectric fluid vapor return manifold coupling in fluid communication the dielectric fluid vapor outlets of the plurality of immersion-cooled electronic subsystems and the vapor-condensing heat exchanger; a reservoir for holding dielectric fluid, the reservoir being at a lower height than the vapor-condensing heat exchanger; a gravity drain line coupled to drain dielectric fluid condensate from the vapor-condensing heat exchanger to the reservoir; an immersed, sub-cooling heat exchanger disposed within the reservoir for cooling dielectric fluid, the immersed, sub-cooling heat exchanger being coupled in series fluid communication with the vapor-condensing heat exchanger, wherein chilled facility coolant passes through the immersed, sub-cooling heat exchanger and then the vapor-condensing heat exchanger; a dielectric fluid supply manifold coupling in fluid communication the reservoir and the dielectric fluid inlets of the plurality of immersion-cooled electronic subsystems; and a pump disposed at an outlet of the reservoir for pumping under pressure dielectric fluid from the reservoir to the dielectric fluid supply manifold for maintaining dielectric fluid in a liquid state within the sealed compartments of the plurality of immersion-cooled electronic subsystems.

In another aspect, a liquid-cooled electronics rack is provided which includes a plurality of immersion-cooled electronic subsystems, each immersion-cooled electronic subsystem comprising: a housing at least partially surrounding and forming a sealed compartment about the electronic subsystem, the electronic subsystem comprising a plurality of electronic components to be cooled; a dielectric fluid disposed within the sealed compartment, wherein the plurality of electronic components to be cooled are at least partially immersed within the dielectric fluid; and a dielectric fluid inlet and a dielectric fluid vapor outlet in fluid communication with the sealed compartment, wherein dielectric fluid is provided to the sealed compartment via the dielectric fluid inlet and dielectric fluid vapor egresses from the sealed compartment via the dielectric fluid vapor outlet. The liquid-cooled electronics rack further includes: a vapor-condensing heat exchanger to facilitate condensing of dielectric fluid vapor egressing from the sealed compartments of the plurality of immersion-cooled electronic subsystems; a dielectric fluid vapor return manifold coupling in fluid communication the dielectric fluid vapor outlets of the plurality of immersion-cooled electronic subsystems and the vapor-condensing heat exchanger; a reservoir for holding dielectric fluid, the reservoir being disposed at a lower height than the vapor-condensing heat exchanger; a gravity drain line coupled to drain dielectric fluid condensate from the vapor-condensing heat exchanger to the reservoir; an immersed, sub-cooling heat exchanger disposed within the reservoir for cooling dielectric fluid; a dielectric fluid supply manifold coupling in fluid communication the reservoir and the dielectric fluid inlets of the plurality of immersion-cooled electronic subsystems; a pump disposed at an outlet of the reservoir for pumping under pressure dielectric fluid from the reservoir to the dielectric fluid supply manifold for maintaining dielectric fluid in liquid state within the sealed compartments of the plurality of immersion-cooled electronic subsystems; and multiple flow restrictors associated with multiple immersion-cooled electronic subsystems of the plurality of immersion-cooled electronic subsystems, each flow restrictor of the multiple flow restrictors being associated with a respective immersion-cooled electronic subsystem of the multiple immersion-cooled electronic subsystems and being disposed in fluid communication with the dielectric fluid inlet to the sealed compartment thereof, and wherein the multiple flow restrictors facilitate balancing dielectric fluid flow from the dielectric fluid supply manifold to the multiple immersion-cooled electronic subsystems of the liquid-cooled electronics rack.

In a further aspect, a method of facilitating cooling of an electronics rack is provided. The method includes: providing a plurality of immersion-cooled electronic subsystems within the electronics rack, each immersion-cooled electronic subsystem comprising: a housing at least partially surrounding and forming a sealed compartment about the electronic subsystem, the electronic subsystem comprising a plurality of electronic components to be cooled; a dielectric fluid disposed within the sealed compartment, wherein the plurality of electronic components to be cooled are at least partially immersed within the dielectric fluid; and a dielectric fluid inlet and a dielectric fluid vapor outlet in fluid communication with the sealed compartment, wherein dielectric fluid is provided to the sealed compartment via the dielectric fluid inlet and dielectric fluid vapor egresses from the sealed compartment via the dielectric fluid vapor outlet. The method further includes: providing a vapor-condensing heat exchanger to facilitate condensing of dielectric fluid vapor egressing from the sealed compartments of the plurality of immersion-cooled electronic subsystems, and a dielectric fluid vapor return manifold coupling in fluid communication the dielectric fluid vapor outlets of the plurality of immersion-cooled electronic subsystems and the vapor-condensing heat exchanger; providing a reservoir for holding dielectric fluid, the reservoir being disposed at a lower height than the vapor-condensing heat exchanger; providing a gravity drain line to drain dielectric fluid condensate from the vapor-condensing heat exchanger to the reservoir; providing an immersed, sub-cooling heat exchanger disposed within the reservoir for cooling dielectric fluid, the immersed, sub-cooling heat exchanger being coupled in series fluid communication with the vapor-condensing heat exchanger, wherein chilled facility coolant passes through the immersed, sub-cooling heat exchanger and then the vapor-condensing heat exchanger; providing a dielectric fluid supply manifold coupling in fluid communication the reservoir and the dielectric fluid inlets of the plurality of immersion-cooled electronic subsystems; and providing a pump disposed at an outlet of the reservoir for supplying under pressure dielectric fluid from the reservoir to the dielectric fluid supply manifold for maintaining dielectric fluid in a liquid state within the sealed compartments of the plurality of immersion-cooled electronic subsystems.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
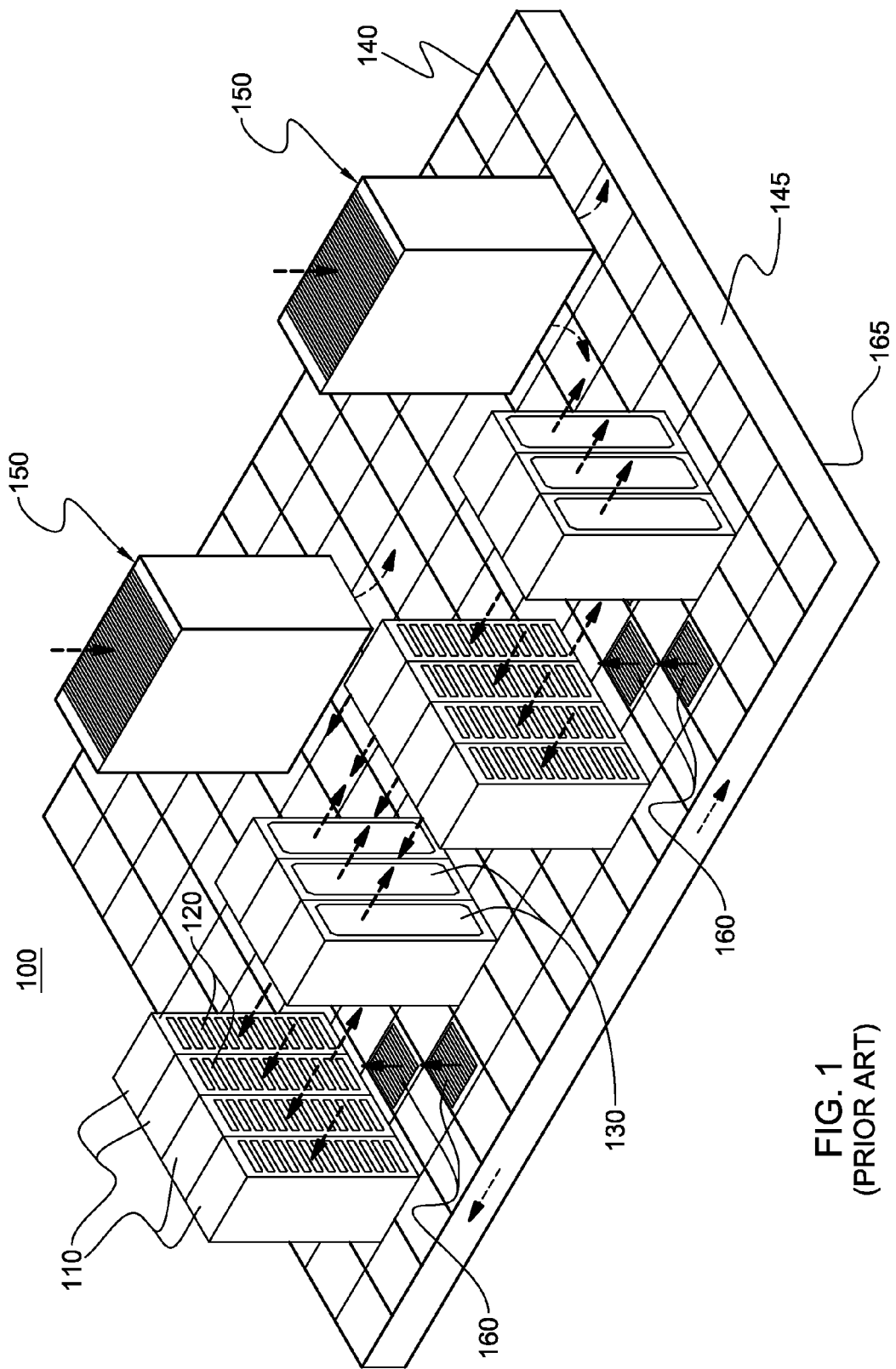
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise one or more electronic subsystems, each having one or more heat generating components disposed therein requiring cooling. "Electronic subsystem" refers to any housing, blade, book, drawer, node, compartment, board, etc., having multiple heat generating electronic components disposed therein or thereon. Each electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system which comprises multiple different types of electronic components, and may be, in one example, a server unit.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "data center" refers to a computer installation containing one or more electronics racks to be cooled. As a specific example, a data center may include one or more rows of rack-mounted computing units, such as server units.

An electronic system chassis may be a multi-blade center system. The blades of each multi-blade center system may be removable, and comprise multiple components to be liquid-cooled. In one example, one or more blades of a multi-blade center system are immersion-cooled blades. "Immersion-cooled blades" refers to any blade, book, node, etc. having multiple components thereof cooled by immersion within coolant flowing through the blade. One detailed example of an immersion-cooled blade is described in commonly assigned U.S. Patent Publication No. 2010/0101759 A1, published Apr. 29, 2010, and entitled "Apparatus and Method for Facilitating Immersion-Cooling of an Electronic Subsystem". Multiple components of an immersion-cooled blade may be directly immersion-cooled by the coolant or indirectly immersion-cooled. Indirect immersion cooling refers to the existence of a thermal cap, thermal spreader, passivation layer, or other surface interposed between a surface of the component and the coolant within which the component is immersed.

As used herein, "heat exchanger" refers to any heat exchange assembly through which a first coolant and a second coolant can circulate. In the embodiments described herein, the first coolant is a liquid coolant, and the second coolant is a two-phase dielectric coolant which condenses within the heat exchanger. The heat exchanger comprises a facility coolant path and a plurality of thermally conductive fins extend into a second coolant path comprising the two-phase dielectric coolant. Size, configuration and construction of the heat exchanger can vary without departing from the scope of the invention disclosed herein.

One example of the facility coolant flowing through the first coolant path is water, and examples of the two-phase dielectric coolant flowing through the second coolant path comprise a fluorocarbon or segregated hydrofluoroether liquid (e.g., FC-86, FC-87, FC-72, HFE-7000, HFE-7100, or HFE-7200, each of which is available from 3M Corporation, St. Paul, Minn., USA). Fluorocarbon liquid typically boils at 30° C.-80° C. at atmospheric pressure, while water boils at 100° C. Those skilled in the art should note, however, that the concepts disclosed herein are readily adapted to other first coolants and second coolants. For example, the first coolant may alternately comprise a brine, a liquid metal, or similar coolant, or a refrigerant, while still maintaining various advantages and unique features of the present invention.

Reference is made below to the drawings (which are not drawn to scale and are simplified for ease of understanding), wherein the same reference numbers used throughout different figures designate the same or similar components.

As shown in FIG. 1, in a raised floor layout of an air-cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the computer installation 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2A:
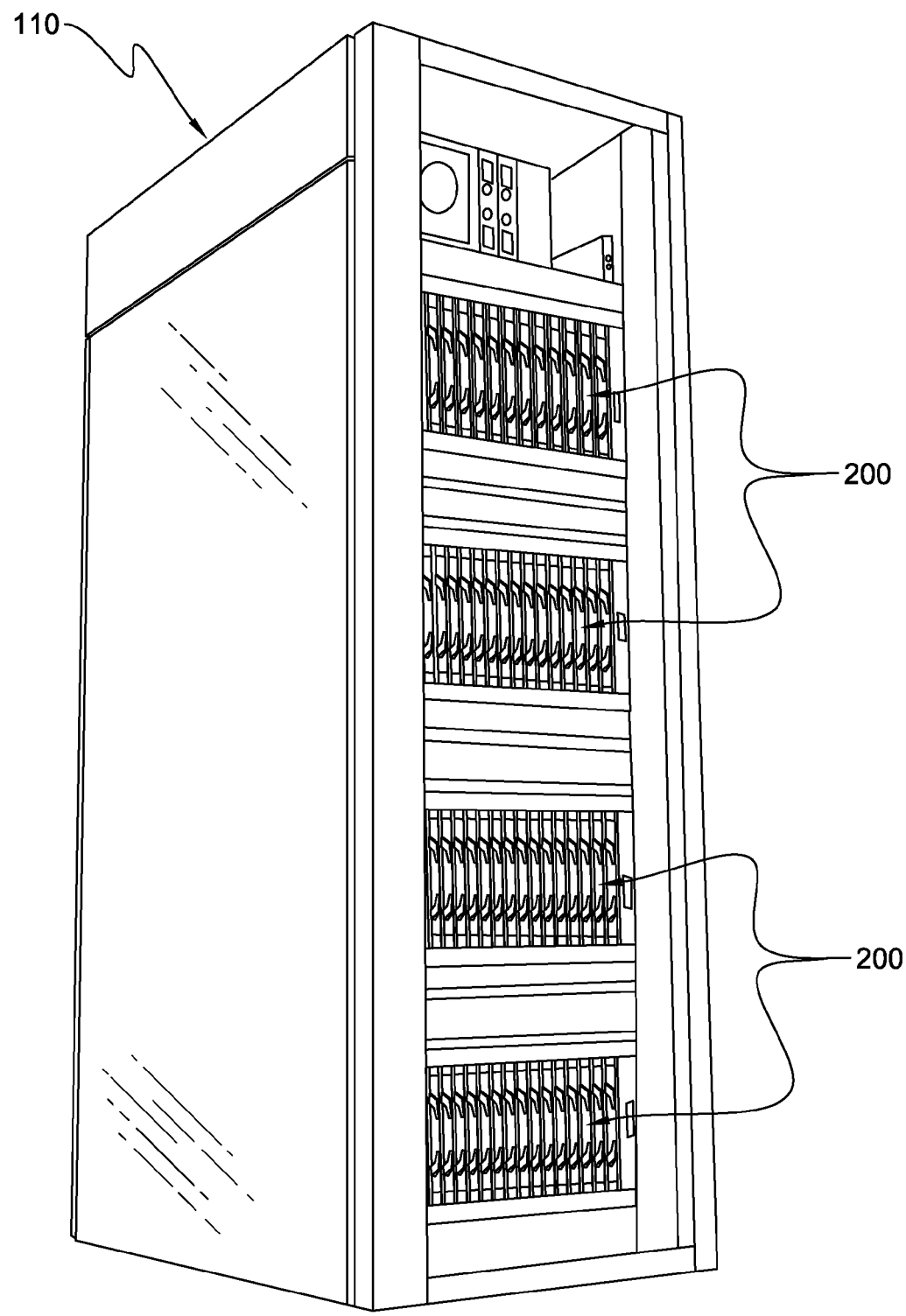
FIG. 2A depicts one embodiment of an electronics rack with a stack of multiple-blade center systems to receive liquid coolant, in accordance with one aspect of the present invention.

FIG. 2A depicts one embodiment of an electronics rack 110 comprising a stack of electronic system chassis or multi-blade center systems 200, as well as supporting power supplies, networking equipment, etc.

Figure 2B:
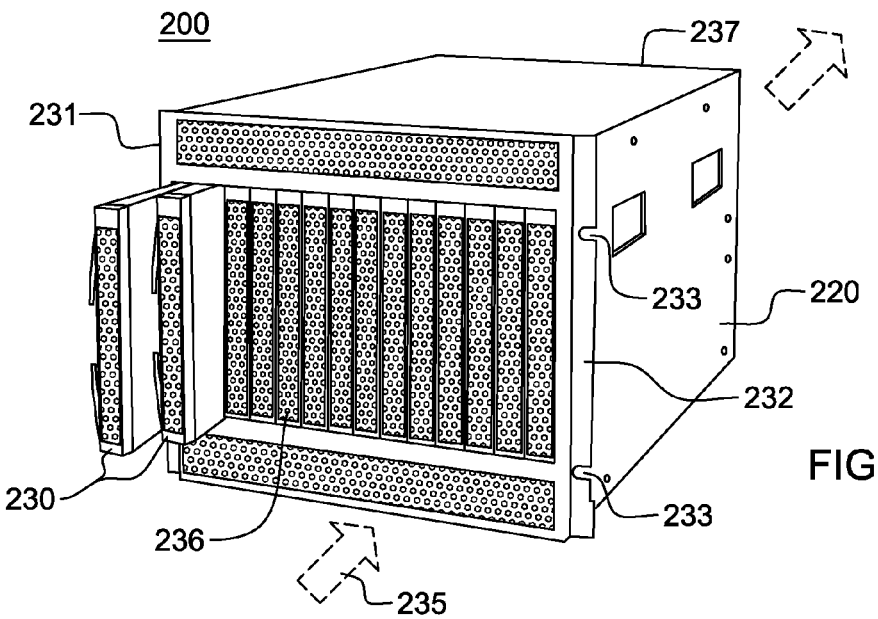
FIG. 2B is an isometric view of one embodiment of one multi-blade center system of the electronics rack of FIG. 2A.

FIG. 2B illustrates one embodiment of multi-blade center system 200, one example of which is marketed by International Business Machines Corporation, of Armonk, N.Y. By way of specific example, multi-blade center system 200 may comprise a stand alone server system which incorporates scalable computing functionality up to, for example, fourteen high performance servers (or blades).

As shown in FIG. 2B, multi-blade center system 200 includes a system chassis 220 and multiple removable blades 230. As one example, each removable blade 230 is an electronics subsystem, such as a server of a multi-server electronics system. A first flange 231 and second flange 232 with openings 233 are also illustrated. Typically, flanges 231, 232 are used to secure the multi-blade center system within an electronics rack, such as depicted in FIG. 2A. Airflow 235 is conventionally provided through an air inlet side 236 of multi-blade center system 210 to an air outlet side 237, and is typically established, for example, by two or more air-moving devices (not shown) disposed at the back portion of the system housing. Electrical and networking infrastructure is also located near the back of system chassis 220.

Figure 2C:
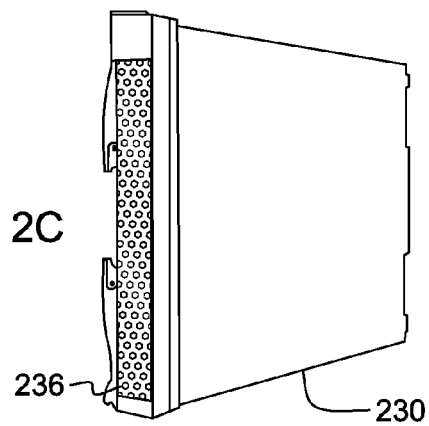
FIG. 2C is an isometric view of one embodiment of an individual removable blade of a multi-blade center system of FIG. 2B.
Figure 2D:
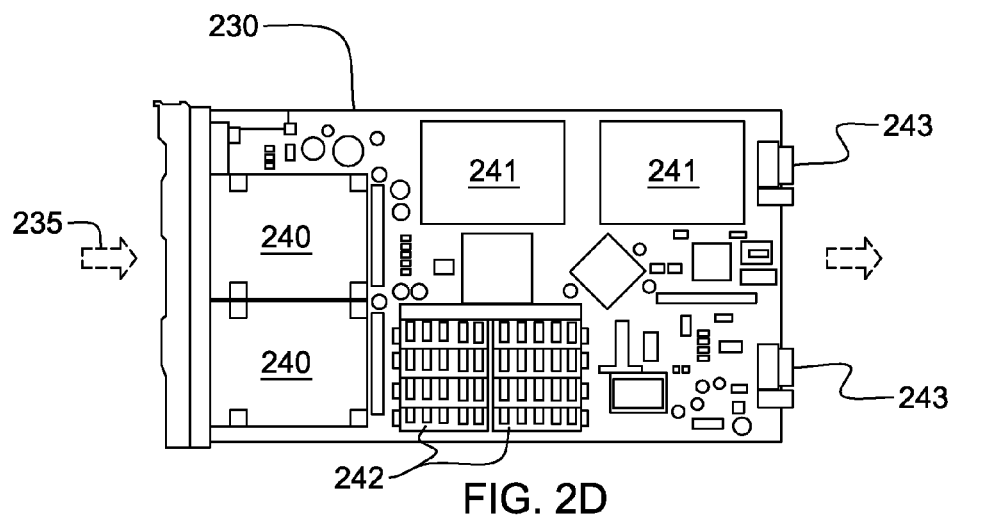
FIG. 2D is a side elevational view of one embodiment of the removable blade of FIG. 2C.

FIGS. 2C & 2D depict one embodiment of a removable blade 230 of the electronic system chassis. As illustrated in FIG. 2D, removable blade 230 includes, for example, multiple processors above which conventionally reside respective air-cooled heat sinks 240. In this example, each removable blade is a complete computer system, or subsystem, and includes, for example, Direct Access Storage Device (DASD) 241 and Dual In-Line Memory Modules (DIMMs) 242. Electrical connectors 243 are provided for electrically connecting blade 230 to the respective electronic system chassis 220 (FIG. 2B). Corresponding electrical connectors are disposed within the electronic system chassis near the back thereof for making electrical connection to connectors 243 when the blade is inserted into the chassis in operational position.

By way of specific example, a typical blade center chassis today is 9 U tall (where 1 U equals 1.75 inches or 44.45 mm) and houses 14 field-replaceable blades, each containing two central processing units (CPUs). A standard electronics rack that is 42 U tall can thus accommodate four such blade center chassis (each 9 U tall), for a total of 56 blades and 112 CPU modules. International Business Machines Corporation markets three versions of a blade center chassis, namely, the BC, BCH and BC-Telco versions. FIGS. 2A-2D illustrate one example of a BCH chassis marketed by International Business Machines Corporation, however, the concepts presented herein are readily applicable to any blade center chassis configuration, as well as to other electronic system housing variants. Further, the liquid cooling apparatus described herein is readily adaptable to use with any housing version with multiple components to be immersion-cooled.

Advantageously, liquid cooling of a multi-blade center system, or an electronics rack such as depicted in FIG. 2A, provides increased cooling at the module and rack level, and enables higher performance systems than currently feasible using air-cooling. Further, a liquid cooling apparatus, such as described below, improves energy efficiency by eliminating or reducing requirements on one or more data center air-conditioning units; that is, by rejecting heat to liquid coolant, which in one example, is subsequently rejected to the ambient environment outside of the data center. With a liquid cooling approach such as described herein, the conventional air-moving devices within the multi-blade center systems and the electronics rack are eliminated, thereby reducing acoustic noise within the data center. Additionally, a reduced form factor of the processor's thermal solution is provided, thus allowing more functionality to be packaged within a single subsystem or blade. This added functionality could be memory, hard drives, or other devices, which would allow for a more competitive offering within the market place.

Disclosed hereinbelow (in one aspect) is a liquid cooling apparatus which achieves 100% liquid cooling of, for example, the blades of a multi-blade center system, whether as a stand alone system, or stacked within an electronics rack with other multi-blade center systems.

Figure 3:
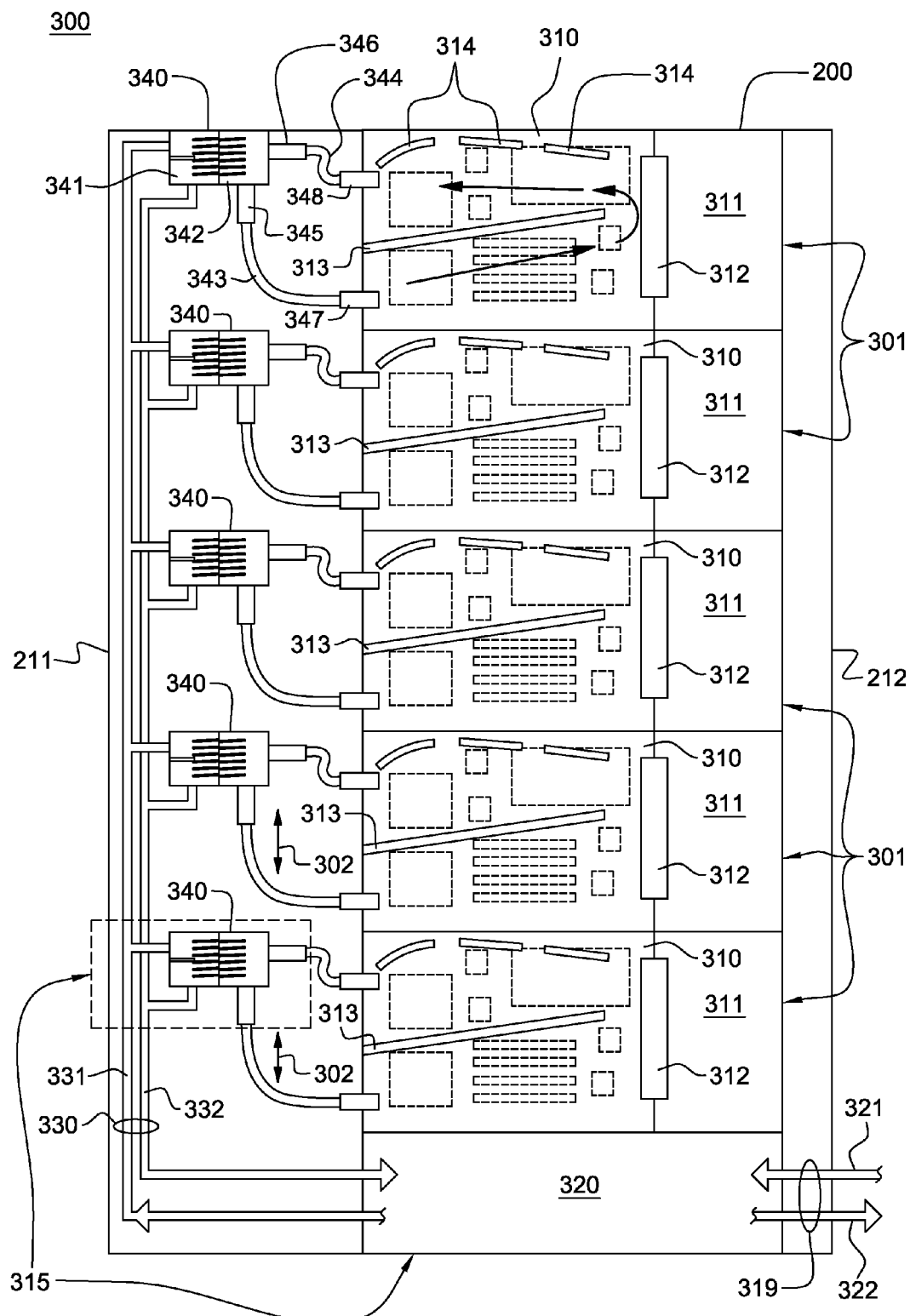
FIG. 3 is a schematic of one embodiment of a liquid-cooled electronics rack comprising (in the illustrated embodiment) a stack of multi-blade center systems and a liquid cooling apparatus, in accordance with an aspect of the present invention.

FIG. 3 is a schematic of one embodiment of a liquid-cooled electronics rack, generally denoted 300, in accordance with an aspect of the present invention. Liquid-cooled electronics rack 300 includes an electronics rack 200 having a plurality of multi-blade center systems 301 stacked within the rack. In this example, five multi-blade center systems 301 are illustrated, with each system being an example of an electronic system chassis. As illustrated in FIG. 3, each multi-blade center system 301 includes a back plane 312, into which respective removable blades 310 are electrically inserted, and a back space 311 which conventionally accommodates one or more air-moving devices (not shown) to cause airflow to flow from a front side 211 to a back side 212 of electronics rack 300 through the multi-blade center system 301.

One embodiment of a liquid cooling apparatus, generally denoted 315, is illustrated in FIG. 3. In this embodiment, a liquid cooling unit 320 is disposed in a lower portion of electronics rack 200. Liquid cooling unit 320 includes, for example, a liquid-to-liquid heat exchanger (not shown) for extracting heat from coolant flowing through a first coolant loop 330 of liquid cooling apparatus 315 and dissipating heat within a facility coolant loop 319 comprising a facility coolant supply line 321 and facility coolant return line 322. In one example, facility coolant supply line 321 and facility coolant return line 322 couple liquid cooling unit 320 to a data center facility coolant supply and return (not shown). Liquid cooling unit 320 further includes an appropriately sized reservoir, pump, and optional filter, for moving liquid coolant through first coolant loop 330. In one embodiment, first coolant loop 330 includes a rack-level inlet manifold 331 and a rack-level outlet manifold 332, which are coupled to liquid cooling unit 320 via, for example, flexible hoses and respective quick connect couplings. The flexible hoses allow the rack-level manifolds to be mounted within, for example, a door of the electronics rack hingedly mounted to the air inlet side of the electronics rack. In one example, rack-level inlet manifold 331 and rack-level outlet manifold 332 each comprise an elongated, rigid tube vertically mounted to electronics rack 200.

In the embodiment illustrated, the rack-level coolant manifold assembly, comprising rack-level inlet manifold 331 and rack-level outlet manifold 332 is in fluid communication with multiple movable chassis-level manifold subassemblies 340. As illustrated in FIG. 3, each movable chassis-level manifold assembly is coupled to the electronics rack to reciprocate vertically (as indicated by arrows 302) adjacent to an associated electronic system chassis to facilitate the removal of individual blades, without impacting cooling of adjacent blades. Respective quick connect couplings may be employed to coupled the rack-level inlet manifold and rack-level outlet manifold to each movable chassis-level manifold assembly 340, using for example appropriately sized, flexible rack-level tubing. The quick connect couplings may be any one of various types of commercially available couplings, such as those available from Colder Products Company, of St. Paul, Minn., USA, or Parker Hannifin, of Cleveland, Ohio, USA.

Each movable chassis-level manifold assembly 340 includes a first chamber 341 and a plurality of second chambers 342 disposed, in this example, within a common structure, but isolated to prevent direct flow of coolant therebetween. As explained further below, the first chamber and the plurality of second chambers are isolated by a heat exchanger which facilitates transfer of heat from coolant flowing through a plurality of second coolant paths passing through the plurality of second chambers to coolant flowing through a first coolant path passing through the first chamber. Heat transferred to coolant passing through the first coolant path of each chassis-level manifold assembly is transferred via the rack-level outlet manifold 332 and liquid cooling unit 320 to facility coolant loop 319. In one example, coolant passing through first coolant loop 330, and hence, coolant passing through the first coolant paths within the movable chassis-level manifold assemblies, is water. In the example illustrated, the vertically oriented rack-level inlet and outlet manifolds each have five ports, which connect to five horizontally oriented, movable chassis-level manifold assemblies 340. The chassis-level manifold assemblies serve as a heat rejection component for the heat load removed from the individual blades 310 of the respective multi-blade center systems 301.

Each second chamber of the plurality of second chambers of each chassis-level manifold assembly 340 has an outlet coupled via flexible tubing 343 to a coolant inlet of a respective immersion-cooled blade 310. In one embodiment, each flexible tubing 343 couples to a respective second chamber of the chassis-level manifold assembly 340 via an appropriate hose barb fitting 345, and couples to the immersion-cooled blade 310 via a quick connect coupling 347. Further, flexible tubing 344 couples an inlet of each second chamber of the plurality of second chambers of each chassis-level manifold assembly 340 to a coolant outlet of the respective immersion-cooled blade 310. At the outlet, a quick connect coupling 348 may again be employed to facilitate connection or disconnection of the corresponding immersion-cooled blade, while at the other end, flexible tubing 344 couples to chassis-level manifold assembly 340 via an appropriate hose barb fitting 346. Flexible tubes 343, 344 are sized and provided with sufficient flexibility to allow the associated movable chassis-level manifold assembly 340 to reciprocate within a designed extent of travel, as illustrated by arrows 302.

As noted, in one example, a two-phase dielectric coolant is employed within immersion-cooled blade 310 and the second chambers of the respective chassis-level manifold assemblies 340. In operation, upper flexible tubing 344 transports vaporized coolant from the immersion-cooled blade 310 to the corresponding second chamber of the chassis-level manifold assembly. This second chamber functions as a condenser, with the lower flexible tubing 343 transporting condensed liquid coolant from the second chamber to the immersion-cooled blade 310 for continued cooling of the immersion-cooled blade. Electronic components within the blade may be exposed either directly or indirectly to the dielectric coolant, and heat transfer takes place via, for example, boiling at one or more surfaces of the heat-producing components. The liquid coolant, and resultant vapor, are directed via one or more baffles 313 to an upper portion of the blade 310, where the vapor rises to the top portion of the blade, and is directed via one or more vapor deflectors 314 back into the second chamber for condensing. Flow of vapor back to the second chamber is facilitated by the liquid-vapor pressure differential between the upper portion of the blade and the corresponding second chamber functioning as the condenser region. Both the first chamber and the plurality of second chambers of the chassis-level manifold assembly have thermally conductive fin structures extending therein from the heat exchanger to enhance heat transfer. These fin structures may comprise pin fin type thermally conductive elements, or plate type thermally conductive elements. The coolant flowing through the first chamber of each chassis-level manifold assembly yields a temperature at the condenser fins in the respective second chambers of the manifold assembly that is well below the boiling point of the dielectric coolant employed in the immersion-cooled blade. As a result, the vapor-condenses over the surfaces of these fins. The condensed liquid may be close in temperature to the vapor, or it could be sub-cooled to a much lower temperature, based on operating conditions on the first coolant loop side of the manifold assembly's heat exchanger.

As a further cooling approach to the above-described liquid-cooled electronics rack, direct immersion-cooling of electronic components of a plurality of horizontally-disposed electronic subsystems within an electronics rack may be employed. Such an immersion-cooling approach also advantageously avoids forced air-cooling and enables total liquid-cooling of the electronics rack within a data center. Where employable, the use of dielectric fluid immersion-cooling may offer several unique benefits over air-cooling or a hybrid air and water cooling approach.

For example, the use of a dielectric fluid that condenses at a temperature above typical outdoor ambient air temperature enables data center cooling architectures which do not require energy-intensive refrigeration chillers. Yet other practical advantages, such as the ability to ship a coolant-filled electronic subsystem, may offer benefit over a water-cooled approach, which typically would require shipping dry and the use of a fill and drain protocol to insure against freeze damage during transport. Also, the use of liquid immersion-cooling may, in certain cases, allow for greater compaction of electronic components at the electronic subsystem level and/or the electronic rack level, since conductive cooling structures may be eliminated. Unlike corrosion-sensitive water-cooled systems, chemically inert dielectric coolant can be employed within an immersion-cooling approach such as described herein, which would not mandate copper as the primary thermally conductive wetted metal. Lower cost and lower mass aluminum structures could replace copper structures wherever thermally viable, and the mixed, wetted metal assemblies would not be vulnerable to galvanic corrosion, such as in a water-based cooling approach. For at least these potential benefits, dielectric fluid immersion-cooling of one or more electronic subsystems of an electronics rack may offer significant energy efficiency and higher performance cooling benefits, compared with currently available air or hybrid air and water cooled systems.

As in the above example, in the examples discussed below, the dielectric fluid (i.e., coolant) may comprise any one of a variety of commercially available dielectric coolants. For example, any of the Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 4A:
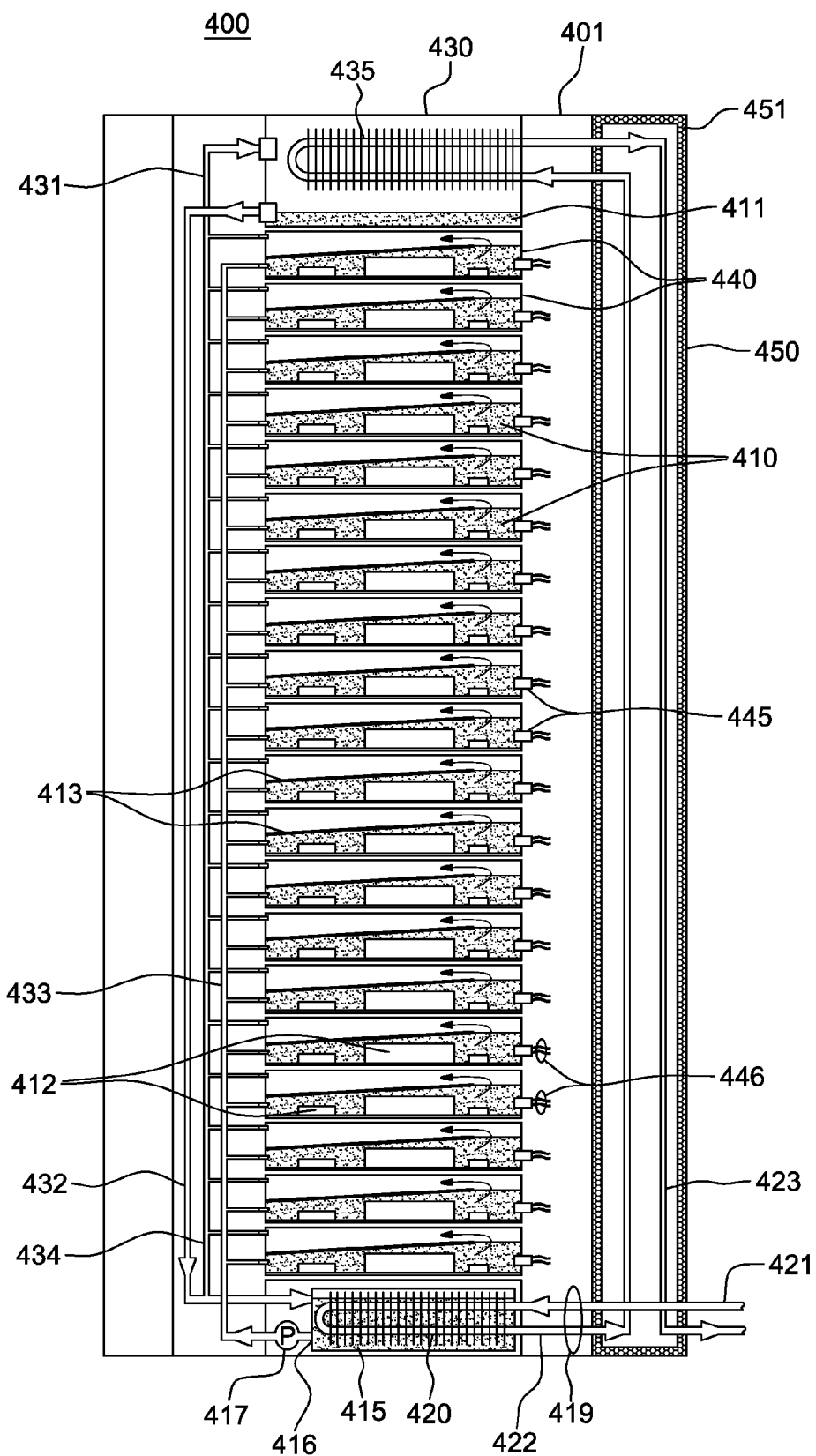
FIG. 4A is an elevational view of one embodiment of a liquid-cooled electronics rack comprising a plurality of horizontally-disposed, immersion-cooled electronic subsystems, in accordance with an aspect of the present invention.

FIG. 4A is a schematic illustration of one embodiment of a liquid-cooled electronics rack, generally denoted 400, employing immersion-cooling of electronic subsystems 410, in accordance with an aspect of the present invention. In this implementation, the plurality of immersion-cooled electronic subsystems 410 are illustrated horizontally-disposed within an electronics rack 401 so as to be essentially stacked within the rack. By way of example, each electronic subsystem 410 may be a server unit of a rack-mounted plurality of server units, and include multiple electronic components to be cooled. In one embodiment, each electronic subsystem comprises multiple different types of electronic components to be cooled having different heights and/or shapes.

Figure 4B:
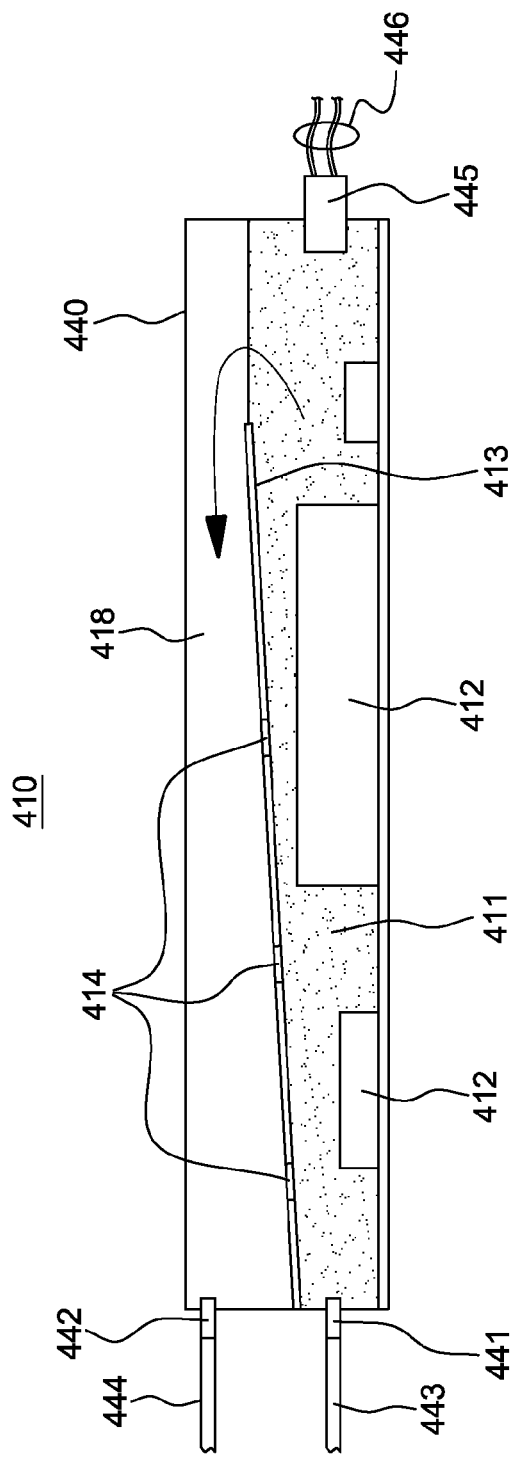
FIG. 4B is a cross-sectional elevational view of one immersion-cooled electronic subsystem of the liquid-cooled electronics rack of FIG. 4A, in accordance with an aspect of the present invention.

Referring collectively to FIGS. 4A & 4B, the immersion-cooled electronic subsystems 410 each comprise (in this example) a housing 440 at least partially surrounding and forming a sealed compartment about the electronic subsystem, with the plurality of electronic components 412 of the electronic subsystem being disposed within the sealed compartment. In one example, electronic components 412 include one or more processors and one or more dual in-line memory module (DIMM) arrays. A dielectric fluid 411 is provided within the sealed compartment, and the plurality of electronic components to be cooled are immersed within dielectric fluid 411. A baffle 413 is provided to facilitate maintaining electronic components 412 immersed within the dielectric fluid, and to direct flow of dielectric fluid vapor generated by boiling of dielectric fluid at one or more surfaces of the electronic components towards a dielectric fluid vapor outlet 442 disposed in an upper portion of the sealed compartment. In one embodiment, baffle 413 includes multiple openings 414 which facilitate drainage of any dielectric fluid in liquid state above baffle 413 back to the lower portion of the sealed compartment, and passage of dielectric fluid vapor from the lower portion of the sealed compartment to the upper portion of the sealed compartment. As illustrated, the housing further includes a dielectric fluid inlet 441 through which dielectric fluid in liquid state is provided to the sealed compartment. A dielectric fluid inlet line 443 and a dielectric fluid outlet line 444 couple to the respective dielectric fluid inlet 441 and dielectric fluid vapor 418 outlet 442.

In an operational state, dielectric fluid 411 pools in the liquid state at the bottom of the sealed compartment and is of sufficient volume to submerge the electronic components 412. Electronic components 412 dissipate varying amounts of power, which cause the dielectric fluid to boil, releasing a dielectric fluid vapor, which rises to the upper portion of the sealed compartment of the housing.

One or more hermetically-sealed electrical connectors 445 are also provided in each sealed housing 440, for example, at a back surface thereof, for docking into a corresponding electrical plane of the electronics rack in order to provide electrical and network connections 446 to the electronic subsystem disposed within the sealed housing when the electronic subsystem is operatively positioned within the sealed housing and the sealed housing is operatively positioned within the electronics rack.

As illustrated in FIGS. 4A & 4B, dielectric fluid outlet lines 444 couple in fluid communication dielectric fluid vapor outlets 442 of immersion-cooled electronic subsystems 410 and a dielectric fluid vapor return manifold 431. Dielectric fluid vapor return manifold 431 in turn couples in fluid communication the dielectric fluid vapor outlet lines 444 and a passive vapor-condensing unit 430 disposed in an upper portion of electronics rack 401. As illustrated, passive vapor-condensing unit 430 comprises a vapor-condensing heat exchanger 435, which (as described below) is cooled by facility coolant, and which condenses the egressing dielectric fluid vapor from the respective immersion-cooled electronic subsystems to produce dielectric fluid 411 condensate. This dielectric fluid condensate drops to the bottom of the passive vapor-condensing unit, which includes a condensate drain port in fluid communication with a gravity drain line 432. Gravity drain line 432 directs dielectric fluid condensate via a gravity to a reservoir 415 disposed in a lower portion of electronics rack 401.

Reservoir 415 includes an immersed, sub-cooling heat exchanger 420 for cooling the dielectric fluid before return of the fluid to the immersion-cooled subsystems. As illustrated, a reservoir outlet 416 and a pump 417 are coupled in fluid communication. Pump 417 supplies dielectric fluid under pressure from reservoir 415 to a dielectric fluid supply manifold 433, which couples in fluid communication reservoir 415 and dielectric fluid inlets 441 of the plurality of immersion-cooled electronic subsystems 410, that is, via respective dielectric fluid inlet lines 443. In the illustrated embodiment, a liquid drain pipe 434 is disposed at a lower end of dielectric fluid vapor return manifold 431, coupling the bottom of the return manifold to gravity drain line 432 for draining any dielectric fluid condensate from dielectric fluid vapor return manifold 431. In one embodiment, this liquid drain line 434 is disposed adjacent to an inlet of reservoir 415. Note that, since principally all the heat transfer in the liquid-cooled electronics racks of FIGS. 4A & 4B occurs via boiling and vapor generation, the total coolant volumetric flow rate to be provided by pump 417 is relatively small.

By way of example only, in one embodiment, the immersed, sub-cooling heat exchanger 420 is a tube and fin heat exchanger, which extracts heat from dielectric fluid within reservoir 415 and dissipates the heat within a facility coolant loop 419, comprising a facility coolant supply line 421 and a facility coolant return line 423. In addition, in the depicted implementation, a facility coolant connect line 422 couples immersed, sub-cooling heat exchanger 420 in series fluid communication with vapor-condensing heat exchanger 435 disposed in the upper portion of the electronics rack. Facility coolant supply and return lines 421, 423 couple the immersed, sub-cooling heat exchanger and vapor-condensing heat exchanger to a data center facility coolant supply and return (not shown). Note that the facility coolant supplied to vapor-condensing heat exchanger 435 needs to be at a temperature below the saturation temperature of the dielectric fluid. By way of example, if the facility coolant is water, a temperature of about 30° C., or higher, may be employed, based on the saturation temperature of the dielectric fluid within the liquid-cooled electronics rack. Such a relatively high coolant temperature means that minimum cooling power is required to produce the facility coolant at the desired temperature to remove heat from the electronics rack.

Note also, in this embodiment, electronics rack 401 comprises a door 450, which is sized to accommodate vertical portions of the facility coolant connect line 422 and facility coolant return line 423. Insulation 451 is provided in door 450 to inhibit condensation on the portion of the facility coolant lines within the door in cases where facility coolant is below the room air dew point.

In general, fluidic coupling between the electronic subsystems and the dielectric fluid manifolds and lines, as well as between the manifolds and the vapor-condensing heat exchanger, and reservoir, and the facility coolant supply and return, can be established using suitable hoses, hose barb fittings and quick disconnect couplers. In one example, the illustrated, vertically-oriented dielectric fluid vapor return and dielectric fluid supply manifolds each include ports which facilitate fluid connection of the respective components to the manifolds via flexible hoses. Respective quick connect couplings may be employed to couple flexible dielectric fluid inlet and outlet lines 443, 444 to the respective dielectric fluid inlets and vapor outlets of the immersion-cooled electronic subsystems, to (for example) allow for removal of a housing and electronic subsystem from the electronics rack. The quick connect couplings may be any one of various types of commercially available couplings, such as those available from Colder Products Company, of St. Paul, Minn., U.S.A., or Parker Hannifin, of Cleveland, Ohio, U.S.A.

Figure 5:
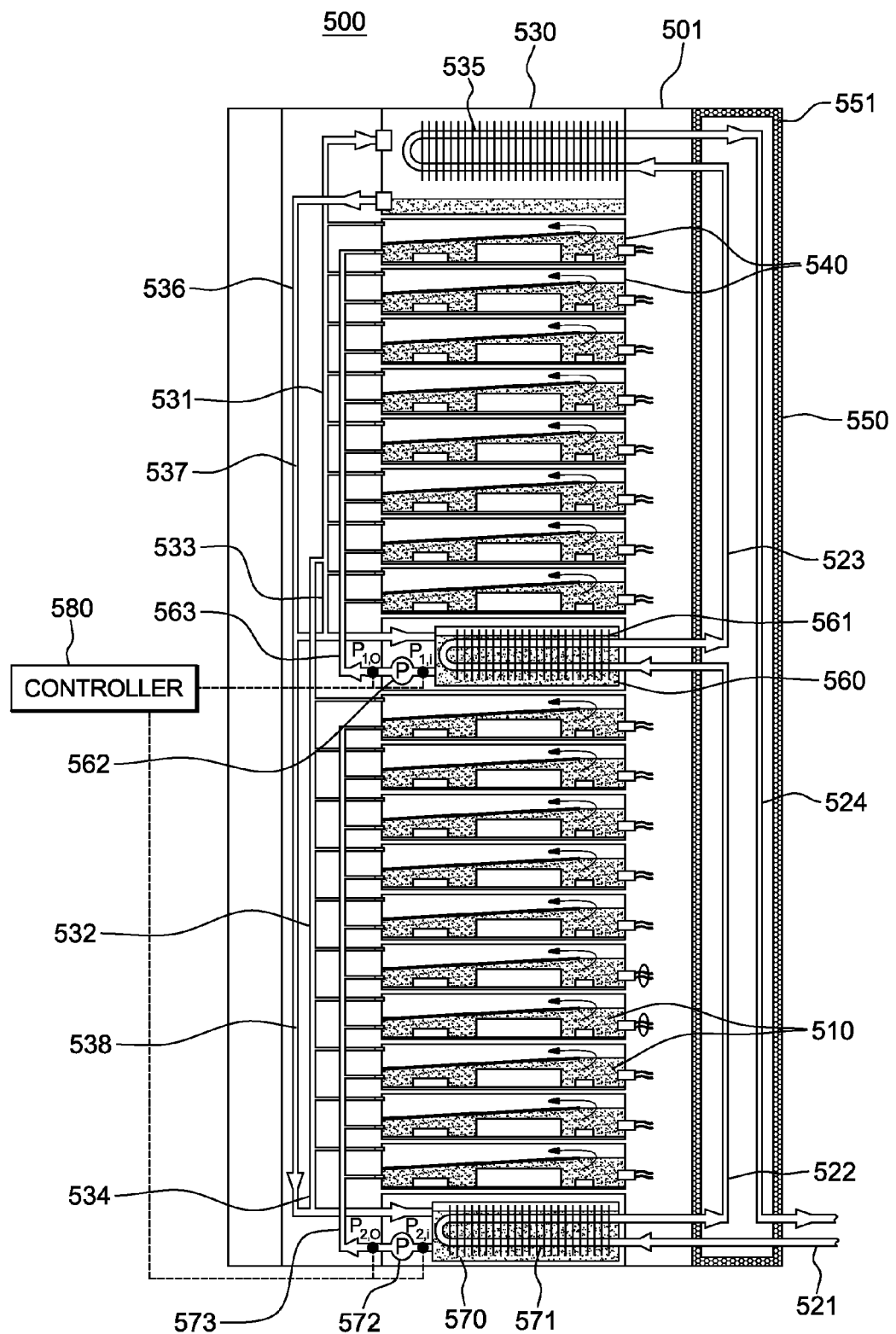
FIG. 5 is an elevational view of another embodiment of a liquid-cooled electronics rack comprising a plurality of immersion-cooled electronic subsystems, in accordance with an aspect of the present invention.

FIG. 5 illustrates an alternate embodiment of a liquid-cooled electronics rack 500 employing immersion-cooling of electronic subsystems 510, in accordance with an aspect of the present invention. In this implementation, the plurality of immersion-cooled electronic subsystems 510 are horizontally-disposed within electronics rack 501, so as to be essentially stacked within the rack.

The immersion-cooled electronic subsystems 510 each comprise (in this example) a sealed housing 540 at least partially surrounding and forming a sealed compartment about the electronic subsystem, with a plurality of electronic components of the electronic subsystem being disposed within the sealed compartment, and a dielectric fluid and baffle provided within the sealed compartment, as described above in connection with the embodiment of FIGS. 4A & 4B. As explained above, the baffles within the sealed compartments facilitate maintaining the electronic components therein immersed within the dielectric fluid, and facilitate directing dielectric fluid vapor, generated by boiling of dielectric fluid at one or more surfaces of the electronic components, towards the dielectric fluid vapor outlet in the upper portion of the sealed compartment. Dielectric fluid inlet lines and dielectric fluid outlet lines are provided coupling the respective dielectric fluid inlets and dielectric fluid vapor outlets to the dielectric fluid supply manifolds 563, 573 and dielectric fluid vapor return manifolds 531, 532, described below.

As illustrated, in this embodiment, the plurality of immersion-cooled electronic subsystems 510 are separated into a first set of immersion-cooled electronic subsystems and a second set of immersion-cooled electronic subsystems. In the example depicted, the two sets of immersion-cooled electronic subsystems are offset by a first reservoir 560 comprising a first immersed, sub-cooling heat exchanger 561. A second reservoir 570 comprising a second immersed, sub-cooling heat exchanger 571 is provided in a lower portion of electronics rack 501. Dielectric fluid condensate returns to the first reservoir 560 and second reservoir 570 via a gravity drain line 536 which couples a dielectric fluid condensate outlet of passive vapor-condensing unit 530 to the respective reservoirs via a first drain line section 537 and a second drain line section 538. As shown, passive vapor-condensing unit 530 includes a vapor-condensing heat exchanger 535 for facilitating condensing of dielectric fluid vapor rising to the passive vapor-condensing unit, that is, via the first and second dielectric fluid vapor return manifolds 531, 532.

Advantageously, by dividing the plurality of immersion-cooled electronic subsystems into a first set and second set, and by providing a first reservoir and a second reservoir, with corresponding structures as illustrated in FIG. 5, maintenance of a desired level of dielectric fluid in liquid state within each immersion-cooled electronic subsystem of the rack is facilitated. This aspect of the present invention is described further below.

First and second immersed, sub-cooling heat exchangers 561, 571 facilitate cooling of dielectric fluid in first reservoir 560 and second reservoir 570, respectively, before return of the fluid to the first and second sets of immersion-cooled electronic subsystems. As illustrated, a first pump 562 is coupled in fluid communication with an outlet of first reservoir 560, and a second pump 572 is coupled in fluid communication with an outlet of second reservoir 570. These pumps 562, 572 may be smaller than the pump described above in connection with the embodiment of FIGS. 4A & 4B, since each pump is pumping a smaller volume of dielectric fluid to the respective first and second dielectric fluid supply manifolds 563, 573 for supplying a smaller number of immersion-cooled electronic subsystems. As illustrated in FIG. 5, a liquid drain pipe 533 is provided at the bottom of first dielectric fluid vapor return manifold 531 and a liquid drain pipe 534 is provided at the bottom of second dielectric fluid vapor return manifold 532 to facilitate draining of any dielectric fluid condensate within the vapor return manifolds back to the gravity drain line, and thus, to facilitate returning the dielectric fluid condensate to the first and second reservoirs.

In the embodiment illustrated, first immersed, sub-cooling heat exchanger 561 and second immersed, sub-cooling heat exchanger 571 each comprise a tube and fin heat exchanger configuration, which extracts heat from dielectric fluid within the respective first and second reservoirs and dissipates the heat within a facility coolant loop comprising a facility coolant supply line 521 and a facility coolant return line 524. In addition, a first facility coolant connect line 522 and a second facility coolant connect line 523 couple the second immersed, sub-cooling heat exchanger 571 and first immersed, sub-cooling heat exchanger 561, and vapor-condensing heat exchanger 535 (in one embodiment) in series fluid communication, as illustrated. (Note that, in another embodiment, the facility coolant lines could couple two or more of the second immersed, sub-cooling heat exchanger 571, first immersed, sub-cooling heat exchanger 561, and vapor-condensing heat exchanger 535 in parallel fluid communication, if desired.) Facility coolant supply and return lines 521, 524 couple the first and second immersed, sub-cooling heat exchangers and the vapor-condensing heat exchanger to a data center facility coolant supply and return (not shown). In the example illustrated, facility coolant first flows via facility coolant supply line 521 through second immersed, sub-cooling heat exchanger 571, and then through first immersed, sub-cooling heat exchanger 561, before passing through vapor-condensing heat exchanger 535. As with the embodiment of FIGS. 4A & 4B, electronics rack 501 includes a door 550, which is sized to accommodate vertical portions of the facility connect lines 522, 523 and facility coolant return lines 524. Insulation 551 is provided in door 550 to inhibit condensation on the portions of the facility coolant lines within the door in cases where the facility coolant temperature is below the dew point of the room air.

Figure 6:
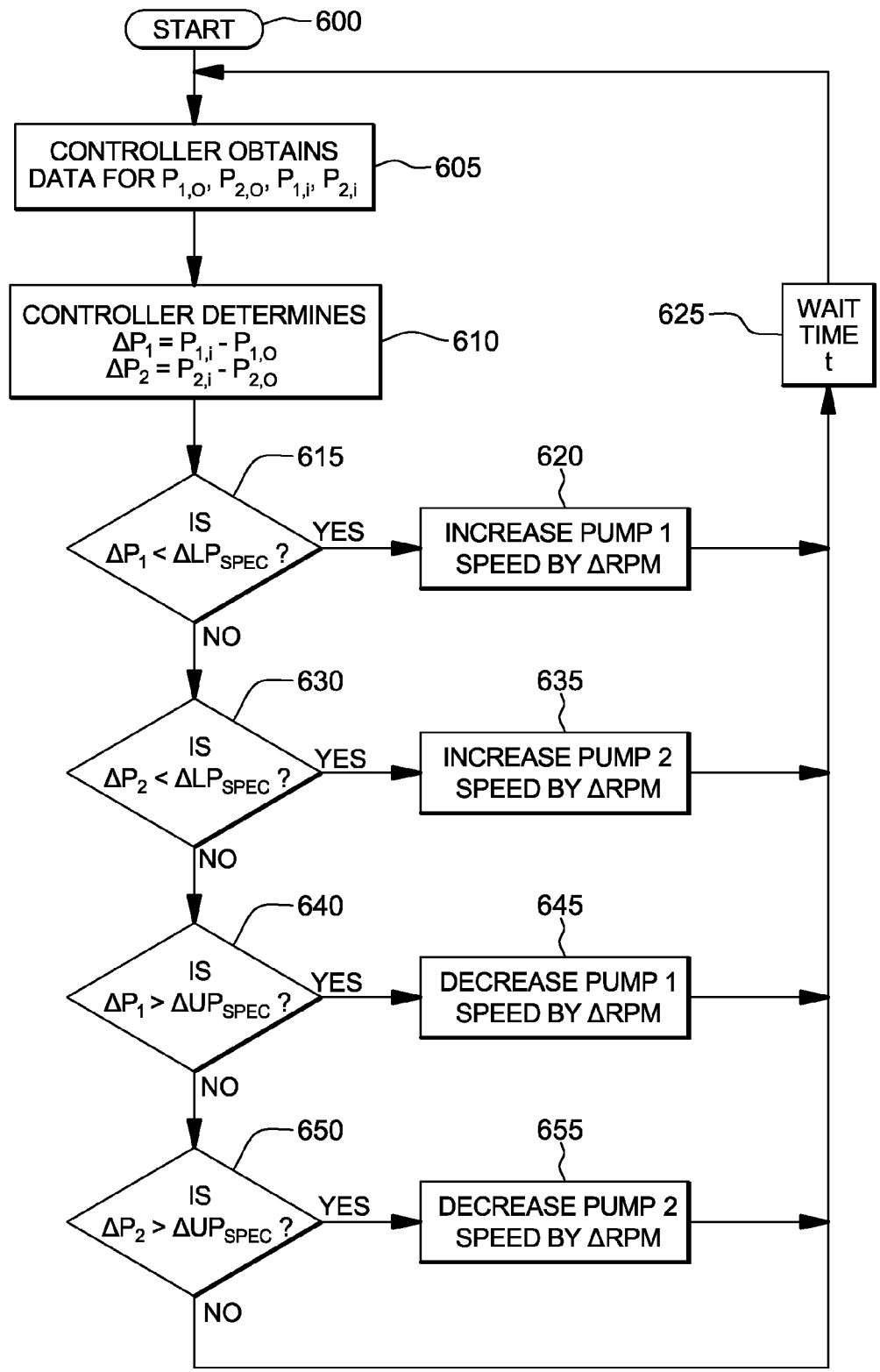
FIG. 6 is a flowchart of one embodiment of processing for automatically adjusting speed of the electronic fluid pumps of the liquid-cooled electronics rack of FIG. 5, in accordance with an aspect of the present invention.

FIG. 5 also illustrates a controller 580, which in one example, may be disposed within electronics rack 501, coupled via respective communication lines to a first pump inlet pressure sensor $P_{1,i}$ and a first pump outlet pressure sensor $P_{1,O}$, as well as to a second pump inlet pressure sensor $P_{2,i}$ and second pump outlet pressure sensor $P_{2,O}$ to facilitate automated monitoring and control of the first and second pumps for maintaining desired dielectric fluid levels within the immersion-cooled electronic subsystems. FIG. 6 illustrates one control approach implemented by controller 580 of the liquid-cooled electronics rack 500 of FIG. 5.

Referring to FIG. 6, the processing starts 600 with the controller obtaining current data for $P_{1,O}$, $P_{2,O}$, $P_{1,i}$, and $P_{2,i}$ 605, and then determining the current pressure differential across first pump and the current pressure differential across the second pump 610. After determining the pressure differential, processing determines whether the current pressure differential across the first pump ($\Delta P_1$) is less than a first, lower pressure differential threshold ($\Delta LP_{SPEC}$) 615, and if so, the speed of pump 1 is increased by a defined amount ($\Delta RPM$) 620, after which the controller waits a time t 625 before repeating the process by obtaining current inlet and outlet pump pressure readings 605.

If the pressure differential across the first pump is above the first, lower pressure differential threshold, then the controller determines whether the pressure differential across the second pump ($\Delta P_2$) is below the first, lower pressure differential threshold 630, and if so, increases the speed of the second pump by a defined amount 635, before waiting time t 625 and then obtaining updated values for the inlet and outlet pump pressures.

If the pressure differential across the first pump and across the second pump are both acceptable, that is, above the first, lower pressure differential threshold, then the controller determines whether the pressure differential across the first pump is above a second, upper pressure differential threshold ($\Delta UP_{SPEC}$) 640. If so, then the speed of the pump is decreased by a set amount 645, after which the controller then waits time t 625 before again obtaining current inlet and outlet pump pressure readings 605.

If the pressure differential across the first pump is below the second, upper pressure differential threshold 640, then the controller determines whether the pressure differential across the second pump is above the second, upper pressure differential threshold 650, and if so, automatically decreases speed of the second pump by a defined amount 655, before waiting time t 625 to repeat obtaining of current inlet and outlet pressure values 605.

If the pressure differential across the first pump and the second pump is neither below specification or above specification, then processing falls through the processing loop to wait time t 625 before obtaining the next current inlet and outlet pump pressure readings 605.

Figure 7:
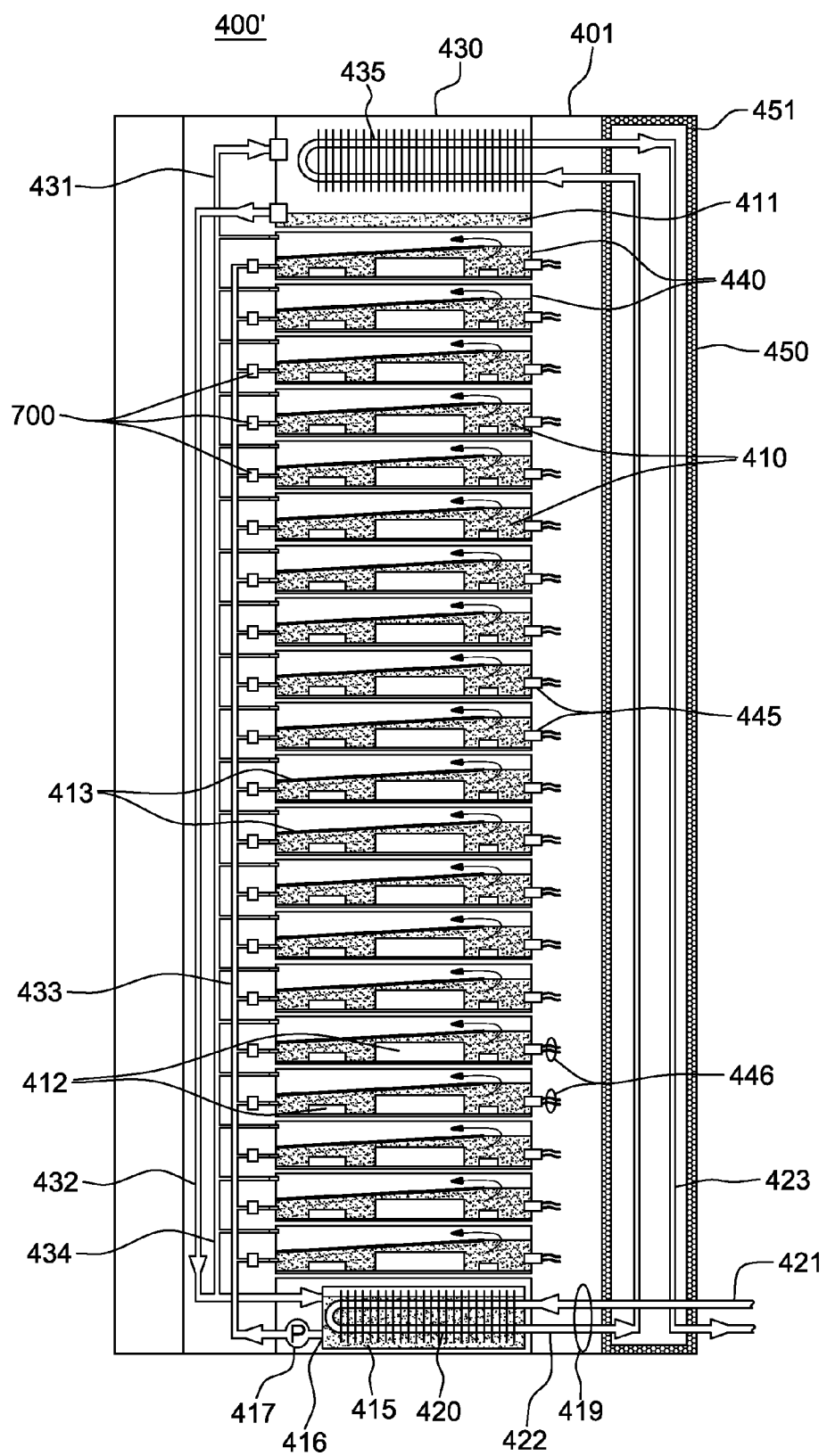
FIG. 7 is an elevational view of another embodiment of a liquid-cooled electronics rack comprising a plurality of immersion-cooled electronic subsystems, in accordance with an aspect of the present invention.

FIG. 7 depicts an alternate embodiment of a liquid-cooled electronics rack 400' comprising a plurality of immersion-cooled electronic subsystems 410. In this example, the liquid-cooled electronics rack is substantially identical to that described above in connection with FIGS. 4A & 4B. One exception is the inclusion of multiple flow restrictors 700 disposed, in this example, at the dielectric fluid inlets to the immersion-cooled electronic subsystems 410. These flow restrictors are configured and positioned to eliminate any maldistribution of dielectric fluid flow through the multiple immersion-cooled electronic subsystems. The flow restrictors provided in the embodiment of FIG. 7 facilitate tailoring dielectric fluid flow resistance through the immersion-cooled electronic subsystems. These flow restrictors may comprise fixed or adjustable flow restrictors, or both.

Fixed flow restrictors comprise a fixed orifice diameter, and two or more of the fixed orifice diameters of the flow restrictors in the liquid-cooled electronics rack may be differently sized to define different coolant flow resistances through at least two different immersion-cooled electronic subsystems, for example, depending on the electronic subsystems to be cooled and/or the location of the electronic subsystems within the rack relative to, for example, pump 417. By defining different dielectric fluid flow resistances, the multiple flow restrictors tailor the dielectric fluid flow to facilitate overall heat transfer within the plurality of immersion-cooled electronic subsystems by, for example, facilitating maintaining a desired liquid level within each of the electronic subsystems.

In an alternative embodiment, the multiple flow restrictors each may be fixed flow restrictors with fixed orifice diameters of equal size. This would ensure a common dielectric fluid flow into the plurality of immersion-cooled electronic subsystems. This implementation might be advantageous where it is assumed that electronic subsystems within the electronics rack are identical, whereas different flow restrictors with different fixed orifice diameters may be beneficial in an implementation where the electronic subsystems are differently sized and/or powered.

Those skilled in the art should note from the above description, that although depicted with reference to the embodiment of FIG. 7, the multiple flow restrictors could also, alternatively, be applied in combination with the liquid-cooled electronics rack embodiment of FIGS. 5 & 6. In addition, although principally described above as fixed flow restrictors, one or more of the multiple flow restrictors could comprise adjustable flow restrictors controlled, for example, with reference to a level of dielectric fluid within the respective immersion-cooled electronic subsystem. Such a configuration would provide an advantage in that each electronic subsystem would be self-monitoring and adjust the dielectric fluid flow resistance therethrough as required to cool the heat load generated by the electronic subsystem. By way of example, various passively controlled, adjustable flow restrictors are provided by Metrix Valve Corp., of Glendora, Calif., U.S.A.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:
1. A liquid-cooled electronics rack comprising:
a plurality of immersion-cooled electronic subsystems, each immersion-cooled electronic subsystem comprising:
a housing at least partially surrounding and forming a sealed compartment about the electronic subsystem, the electronic subsystem comprising a plurality of electronic components to be cooled;

a dielectric fluid disposed within the sealed compartment, wherein the plurality of electronic components to be cooled are at least partially immersed within the dielectric fluid; and a dielectric fluid inlet and a dielectric fluid vapor outlet in fluid communication with the sealed compartment, wherein the dielectric fluid is provided to the sealed compartment via the dielectric fluid inlet and dielectric fluid vapor egresses from the sealed compartment via the dielectric fluid vapor outlet;

a vapor-condensing heat exchanger to facilitate condensing of the dielectric fluid vapor egressing from the sealed compartments of the plurality of immersion-cooled electronic subsystems;

a dielectric fluid vapor return manifold coupling in fluid communication the dielectric fluid vapor outlets of the plurality of immersion-cooled electronic subsystems and the vapor-condensing heat exchanger;

a reservoir for holding the dielectric fluid, the reservoir being disposed at a lower height than the vapor-condensing heat exchanger;

a gravity drain line coupled to drain dielectric fluid condensate from the vapor-condensing heat exchanger to the reservoir;

an immersed, sub-cooling heat exchanger disposed within the reservoir for cooling the dielectric fluid, the immersed, sub-cooling heat exchanger being coupled in series fluid communication with the vapor-condensing heat exchanger, wherein chilled facility coolant passes through the immersed, sub-cooling heat exchanger and then the vapor-condensing heat exchanger;

a dielectric fluid supply manifold coupling in fluid communication the reservoir and the dielectric fluid inlets of the plurality of immersion-cooled electronic subsystems; and a pump associated with the reservoir for pumping under pressure the dielectric fluid from the reservoir to the dielectric fluid supply manifold for maintaining the dielectric fluid in a liquid state within the sealed compartments of the plurality of immersion-cooled electronic subsystems.

2. The liquid-cooled electronics rack of claim 1, wherein the liquid-cooled electronics rack holds the plurality of immersion-cooled electronic subsystems, and wherein the vapor-condensing heat exchanger is disposed in an upper portion of the liquid-cooled electronics rack, and the reservoir and the immersed, sub-cooling heat exchanger disposed therein are disposed within the liquid-cooled electronics rack below the vapor-condensing heat exchanger.

3. The liquid-cooled electronics rack of claim 2, wherein the reservoir and the immersed, sub-cooling heat exchanger disposed therein comprise a first reservoir and a first immersed, sub-cooling heat exchanger, respectively, and wherein the liquid-cooled electronics rack further comprises a second reservoir and a second immersed, sub-cooling heat exchanger disposed therein, the second reservoir and the second immersed, sub-cooling heat exchanger disposed therein being disposed in a lower portion of the liquid-cooled electronics rack, and the first reservoir with the first immersed, sub-cooling heat exchanger disposed therein being positioned between the vapor-condensing heat exchanger and the second reservoir with the second immersed, sub-cooling heat exchanger disposed therein, and wherein the second immersed, sub-cooling heat exchanger, first immersed, sub-cooling heat exchanger and vapor-condensing heat exchanger are coupled in series fluid communication for passage of the chilled facility coolant therethrough.

4. The liquid-cooled electronics rack of claim 3, wherein the chilled facility coolant passes through the second immersed, sub-cooling heat exchanger, and then the first immersed, sub-cooling heat exchanger, before passing through the vapor-condensing heat exchanger.

5. The liquid-cooled electronics rack of claim 3, wherein the dielectric fluid supply manifold comprises a first dielectric fluid supply manifold and the pump comprises a first pump for supplying the dielectric fluid to the dielectric fluid inlets of a first set of immersion-cooled electronic subsystems of the plurality of immersion-cooled electronic subsystems, and wherein the liquid-cooled electronics rack further comprises a second dielectric fluid supply manifold coupling in fluid communication the second reservoir and dielectric fluid inlets of a second set of immersion-cooled electronic subsystems of the plurality of immersion-cooled electronic subsystems, and a second pump for pumping under pressure the dielectric fluid from the second reservoir to the second dielectric fluid supply manifold for maintaining the dielectric fluid in liquid state within the sealed compartments of the second set of immersion-cooled electronic subsystems.

6. The liquid-cooled electronics rack of claim 5, further comprising a controller for monitoring pressure at an inlet and at an outlet of the first pump and for monitoring pressure at an inlet and at an outlet of the second pump, and for determining whether a pressure differential across the first pump or a pressure differential across the second pump is below a first, lower pressure differential threshold, and if so, increasing speed of the respective first pump or second pump with a below-specification pressure differential, and determining whether the pressure differential across the first pump or the pressure differential across the second pump is above a second, upper pressure differential threshold, and if so, automatically decreasing speed of the respective first pump or second pump with an above-specification pressure differential.

7. The liquid-cooled electronics rack of claim 5, wherein the dielectric fluid vapor return manifold comprises a first dielectric fluid vapor return manifold, and wherein the liquid-cooled electronics rack further comprises a second dielectric fluid vapor return manifold, the first dielectric fluid vapor return manifold coupling in fluid communication the dielectric fluid vapor outlets of the first set of immersion-cooled electronic subsystems and the vapor-condensing heat exchanger, and the second dielectric fluid vapor return manifold coupling in fluid communication the dielectric fluid vapor outlets of the second set of immersion-cooled electronic subsystems and the vapor-condensing heat exchanger.

8. The liquid-cooled electronics rack of claim 7, wherein the gravity drain line comprises a first drain line section coupling the gravity drain line in fluid communication with the first reservoir and a second drain line section coupling the gravity drain line in fluid communication with the second reservoir, and wherein the first dielectric fluid vapor return manifold comprises a first liquid drain pipe coupling in fluid communication the first dielectric fluid vapor return manifold and the first drain line section, coupling in fluid communication the gravity drain line and the first reservoir, and the second dielectric fluid vapor return manifold comprises a second liquid drain pipe coupling in fluid communication the second dielectric fluid vapor return manifold and the second drain line section coupling in fluid communication the gravity drain line and the second reservoir, wherein the first liquid drain pipe and the second liquid drain pipe extend from a lower portion of the first dielectric fluid vapor return manifold and the second dielectric fluid vapor return manifold, respectively.

9. The liquid-cooled electronics rack of claim 2, wherein the plurality of immersion-cooled electronic subsystems are horizontally disposed within the liquid-cooled electronics rack, each with the plurality of electronic components thereof being positioned in a lower portion of the sealed compartment and immersed within the dielectric fluid, and wherein at least one immersion-cooled electronic subsystem of the plurality of immersion-cooled electronic subsystems further comprises a baffle disposed within the sealed compartment to facilitate immersion cooling of the electronic components thereof and to facilitate directing the dielectric fluid vapor towards the dielectric fluid vapor outlet of the sealed compartment.

10. The liquid-cooled electronics rack of claim 2, further comprising an insulated door coupled to the liquid-cooled electronics rack, the insulated door accommodating facility coolant lines coupling in series fluid communication the immersed, sub-cooling heat exchanger and the vapor-condensing heat exchanger for passage of the chilled facility coolant therethrough.

11. The liquid-cooled electronics rack of claim 1, further comprising at least one flow restrictor associated with at least one dielectric fluid inlet of at least one immersion-cooled electronic subsystem for tailoring the dielectric fluid flow resistance into the sealed compartment of the at least one immersion-cooled electronic subsystem, and wherein the at least one flow restrictor facilitates tailoring dielectric fluid flow resistance through the liquid-cooled electronics rack to enhance dielectric fluid distribution within the liquid-cooled electronics rack, and therefore overall heat transfer of the liquid-cooled electronics rack.

12. A liquid-cooled electronics rack comprising:
a plurality of immersion-cooled electronic subsystems, each immersion-cooled electronic subsystem comprising:
a housing at least partially surrounding and forming a sealed compartment about the electronic subsystem, the electronic subsystem comprising a plurality of electronic components to be cooled;
a dielectric fluid disposed within the sealed compartment, wherein the plurality of electronic components to be cooled are at least partially immersed within the dielectric fluid; and
a dielectric fluid inlet and a dielectric fluid vapor outlet in fluid communication with the sealed compartment, wherein the dielectric fluid is provided to the sealed compartment via the dielectric fluid inlet and dielectric fluid vapor egresses from the sealed compartment via the dielectric fluid vapor outlet;
a vapor-condensing heat exchanger to facilitate condensing of the dielectric fluid vapor egressing from the sealed compartments of the plurality of immersion-cooled electronic subsystems;
a dielectric fluid vapor return manifold coupling in fluid communication the dielectric fluid vapor outlets of the plurality of immersion-cooled electronic subsystems and the vapor-condensing heat exchanger;
a reservoir for holding the dielectric fluid, the reservoir being disposed at a lower height than the vapor-condensing heat exchanger;
a gravity drain line coupled to drain the dielectric fluid condensate from the vapor-condensing heat exchanger to the reservoir;
an immersed, sub-cooling heat exchanger disposed within the reservoir for cooling the dielectric fluid;
a dielectric fluid supply manifold coupling in fluid communication the reservoir and the dielectric fluid inlets of the plurality of immersion-cooled electronic subsystems;
a pump disposed at an outlet of the reservoir for pumping under pressure the dielectric fluid from the reservoir to the dielectric fluid supply manifold for maintaining the dielectric fluid in a liquid state within the sealed compartments of the plurality of immersion-cooled electronic subsystems; and
multiple flow restrictors associated with multiple immersion-cooled electronic subsystems of the plurality of immersion-cooled electronic subsystems, each flow restrictor of the multiple flow restrictors being associated with a respective immersion-cooled electronic subsystem of the multiple immersion-cooled electronic subsystems and being disposed in fluid communication with the dielectric fluid inlet to the sealed compartment thereof, and wherein the multiple flow restrictors facilitate balancing dielectric fluid flow from the dielectric fluid supply manifold to the multiple immersion-cooled electronic subsystems of the liquid-cooled electronics rack.

13. The liquid-cooled electronics rack of claim 12, wherein the each flow restrictor of the multiple flow restrictors comprises a respective fixed diameter orifice, and at least two respective fixed diameter orifices of at least two flow restrictors of the multiple flow restrictors have different diameters.

14. The liquid-cooled electronics rack of claim 12, wherein the multiple flow restrictors facilitate defining different dielectric fluid flow resistances through at least two immersion-cooled electronic subsystems of the multiple immersion-cooled electronic subsystems.

15. The liquid-cooled electronics rack of claim 12, wherein the multiple flow restrictors tailor dielectric fluid flow resistance through the multiple immersion-cooled electronic subsystems to facilitate maintaining a desired level of the dielectric fluid in liquid state within each immersion-cooled electronic subsystem of the multiple immersion-cooled electronic subsystems.

16. The liquid-cooled electronics rack of claim 12, wherein the liquid-cooled electronics rack holds the plurality of immersion-cooled electronic subsystems, and wherein the vapor-condensing heat exchanger is disposed in an upper portion of the liquid-cooled electronics rack, and the reservoir and the immersed, sub-cooling heat exchanger disposed therein are disposed within the liquid-cooled electronics rack below the vapor-condensing heat exchanger.

17. The liquid-cooled electronics rack of claim 12, further comprising an insulated door coupled to the liquid-cooled electronics rack, the insulated door accommodating facility coolant lines coupling in series fluid communication the immersed, sub-cooling heat exchanger and the vapor-condensing heat exchanger, wherein chilled facility coolant passes from one of the facility coolant lines, through the immersed, sub-cooling heat exchanger then the vapor-condensing heat exchanger, and returning to another of the facility coolant lines.

18. A method of facilitating cooling of a liquid-cooled electronics rack, the method comprising:
providing a plurality of immersion-cooled electronic subsystems within the liquid-cooled electronics rack, each immersion-cooled electronic subsystem comprising:
a housing at least partially surrounding and forming a sealed compartment about the electronic subsystem, the electronic subsystem comprising a plurality of electronic components to be cooled;

a dielectric fluid disposed within the sealed compartment, wherein the plurality of electronic components to be cooled are at least partially immersed within the dielectric fluid; and a dielectric fluid inlet and a dielectric fluid vapor outlet in fluid communication with the sealed compartment, wherein the dielectric fluid is provided to the sealed compartment via the dielectric fluid inlet and dielectric fluid vapor egresses from the sealed compartment via the dielectric fluid vapor outlet;

providing a vapor-condensing heat exchanger to facilitate condensing of the dielectric fluid vapor egressing from the sealed compartments of the plurality of immersion-cooled electronic subsystems, and a dielectric fluid vapor return manifold coupling in fluid communication the dielectric fluid vapor outlets of the plurality of immersion-cooled electronic subsystems and the vapor-condensing heat exchanger;

providing a reservoir for holding the dielectric fluid, the reservoir being disposed at a lower height than the vapor-condensing heat exchanger;

providing a gravity drain line to drain dielectric fluid condensate from the vapor-condensing heat exchanger to the reservoir;

providing an immersed, sub-cooling heat exchanger disposed within the reservoir for cooling the dielectric fluid, the immersed, sub-cooling heat exchanger being coupled in series fluid communication with the vapor-condensing heat exchanger, wherein chilled facility coolant passes through the immersed, sub-cooling heat exchanger and then the vapor-condensing heat exchanger;

providing a dielectric fluid supply manifold coupling in fluid communication the reservoir and the dielectric fluid inlets of the plurality of immersion-cooled electronic subsystems; and providing a pump disposed at an outlet of the reservoir for pumping under pressure the dielectric fluid from the reservoir to the dielectric fluid supply manifold for maintaining the dielectric fluid in a liquid state within the sealed compartments of the plurality of immersion-cooled electronic subsystems.

19. The method of claim 18, further comprising providing the liquid-cooled electronics rack, and wherein providing the vapor-condensing heat exchanger comprises disposing the vapor-condensing heat exchanger in an upper portion of the liquid-cooled electronics rack, and providing the reservoir comprises disposing the reservoir within the liquid-cooled electronics rack below the vapor-condensing heat exchanger.

20. The method of claim 19, further comprising providing at least one flow restrictor associated with at least one dielectric fluid inlet of at least one immersion-cooled electronic subsystem for tailoring the dielectric fluid flow resistance into the sealed compartment of the at least one immersion-cooled electronic subsystem, and wherein the at least one flow restrictor facilitates tailoring dielectric fluid flow resistance through the liquid-cooled electronics rack to enhance dielectric fluid distribution within the liquid-cooled electronics rack, and therefore overall heat transfer of the liquid-cooled electronics rack.

* * * * *